United States Patent
Yang et al.

(10) Patent No.: US 9,412,816 B2
(45) Date of Patent: Aug. 9, 2016

(54) SEMICONDUCTOR DEVICE INCLUDING MULTIPLE NANOWIRE TRANSISTOR

(71) Applicant: Samsung Electronics Co., Ltd., Suwon-Si, Gyeonggi-Do (KR)

(72) Inventors: Jung-gil Yang, Suwon-si (KR); Sang-su Kim, Yongin-si (KR); Tae-yong Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/605,041

(22) Filed: Jan. 26, 2015

(65) Prior Publication Data

US 2015/0243733 A1    Aug. 27, 2015

(30) Foreign Application Priority Data

Feb. 21, 2014   (KR) .................. 10-2014-0020812

(51) Int. Cl.
*H01L 29/06*   (2006.01)
*H01L 29/78*   (2006.01)
*H01L 29/66*   (2006.01)
*H01L 29/775*  (2006.01)

(52) U.S. Cl.
CPC ...... *H01L 29/0673* (2013.01); *H01L 29/66431* (2013.01); *H01L 29/775* (2013.01); *H01L 29/785* (2013.01)

(58) Field of Classification Search
None
See application file for complete search history.

(56) References Cited

U.S. PATENT DOCUMENTS

| 8,472,239 B2 | 6/2013 | Chang et al. |
| 2005/0266645 A1 | 12/2005 | Park |
| 2007/0122983 A1 | 5/2007 | Pan et al. |
| 2011/0042748 A1 | 2/2011 | Anderson et al. |
| 2013/0017673 A1 | 1/2013 | Bangsaruntip et al. |
| 2013/0113042 A1 | 5/2013 | Wang et al. |
| 2013/0161756 A1 | 6/2013 | Glass et al. |
| 2013/0270512 A1* | 10/2013 | Radosavljevic . H01L 21/823807 257/9 |
| 2014/0035041 A1* | 2/2014 | Pillarisetty ............ H01L 21/845 257/365 |
| 2014/0353574 A1* | 12/2014 | Li ....................... H01L 29/0673 257/9 |
| 2015/0228480 A1* | 8/2015 | Yin ......................... H01L 29/00 438/283 |
| 2015/0236092 A1* | 8/2015 | Yu ....................... H01L 29/0676 257/29 |

FOREIGN PATENT DOCUMENTS

JP   2011029503 A   2/2011

OTHER PUBLICATIONS http://www.merriam-webster.com/dictionary/width; 2015.*
A. Medury, "Threshold voltage modeling under size quantization for ultra-thin silicon double-gate metal-oxide-semiconductor field-effect transistor", Journal of Applied Physics, (2012), 10pgs, 112, 024513, Japan.

* cited by examiner

*Primary Examiner* — Yu Chen
*Assistant Examiner* — Nilufa Rahim
(74) *Attorney, Agent, or Firm* — Harness, Dickey & Pierce, P.L.C.

(57) ABSTRACT

A semiconductor device comprises at least two nanowire patterns over a substrate, wherein the at least two nanowire patterns have increasingly narrower widths as they extend away from the substrate and have different channel impurity concentrations. A gate electrode surrounds at least a part of the at least two nanowire patterns. A gate dielectric film is disposed between the at least two nanowire patterns and the gate electrode.

15 Claims, 19 Drawing Sheets

XA-XA'

YA-YA'

YB-YB'

XA-XA'

XA-XA'

XA-XA'

XA-XA'

YA-YA'

YB-YB'

SEMICONDUCTOR DEVICE INCLUDING MULTIPLE NANOWIRE TRANSISTOR

CROSS-REFERENCE TO RELATED APPLICATIONS

This application claims priority from Korean Patent Application No. 10-2014-0020812, filed on Feb. 21, 2014, in the Korean Intellectual Property Office, the disclosure of which is incorporated herein in its entirety by reference.

BACKGROUND

The example inventive concepts relates to a semiconductor device, and/or to a semiconductor device including a multiple nanowire transistor.

To reduce a short channel effect (SCE) caused by a high integration of a semiconductor device, various technologies of the multiple nanowire transistor have been developed. Respective channel regions formed at a plurality of nanowire patterns in the multiple nanowire transistor may have different channel threshold voltages from each other. Accordingly, on-current characteristics of the multiple nanowire transistor may deteriorate.

SUMMARY

At least one example embodiment of inventive concepts provide a semiconductor device including a multiple nanowire transistor that may improve an on-current characteristics.

According to at least one example of the inventive concepts, a semiconductor device includes a substrate, at least two nanowire patterns over the substrate, wherein the at least two nanowire patterns have increasingly narrower widths as in a direction away from the substrate and have different channel impurity concentrations, a gate electrode surrounding at least a part of the at least two nanowire patterns, and a gate dielectric film between the at least two nanowire patterns and the gate electrode.

The at least two nanowire patterns may comprise respective channel regions having increasingly higher channel impurity concentrations in the direction away from the substrate and having different channel widths. The at least two nanowire patterns may comprise respective channel regions that may share a substantially same channel threshold voltage.

The example semiconductor device may further include a pair of source/drain regions connected to both end portions of the respective channel regions of the at least two nanowire patterns. The source/drain regions may be spaced apart from the substrate by a distance.

The at least two nanowire patterns may include a nanowire pattern closest to the substrate, wherein the nanowire pattern may include an undoped semiconductor material.

According to at least one example embodiment, the at least two nanowire patterns may include a first nanowire pattern having a first channel region at a first distance from the substrate and having a first channel impurity concentration and a first channel width, and a second nanowire pattern having a second channel region at a second distance greater than the first distance from the substrate, and having a second channel impurity concentration that is higher than the first channel impurity concentration, and a second channel width smaller than the first channel width. A first channel threshold voltage of the first channel region may be substantially the same as a second channel threshold voltage of the second channel region.

In another example embodiment, the at least two nanowire patterns may further include a third nanowire pattern having a third channel region at a third distance greater than the second distance from the substrate, and has a third channel impurity concentration that is higher than the second channel impurity concentration, and a third channel width that is smaller than the second channel width, wherein the first channel threshold voltage of the first channel region may be substantially the same as a third channel threshold voltage of the third channel region.

The at least two nanowire patterns may have a substantially same thickness.

The semiconductor device may further comprise a plurality of sacrificial film patterns, wherein the sacrificial film patterns are between nanowire patterns, respectively. The gate electrode may pass through at least a part of each sacrificial film pattern.

The at least two nanowire patterns may be at different distances from the substrate to overlap at least a part of the respective nanowire patterns in a direction perpendicular with respect to a surface of the substrate.

The semiconductor device may further include a device isolation film delimiting an active region in the substrate. The at least two nanowire patterns may be a part of a fin shaped pattern structure that upwardly protrudes from a top surface of the device isolation film.

According to another example embodiment of the inventive concepts, a semiconductor device includes a plurality of nanowire patterns that provides a plurality of channel regions at different distances from a substrate, and having different sizes in the channel width of the first direction and different impurity concentrations, a gate electrode surrounding the plurality of channel regions and extending in the first direction, a gate dielectric film between the plurality of the channel regions and the gate electrode, and a pair of source/drain regions connected to both end portions of the plurality of channel regions.

The example semiconductor device may further comprise a plurality of insulating spacers in a space between the pair of source/drain regions and between the plurality of nanowire patterns, and are connected to the pair of source/drain regions and the gate dielectric film, respectively.

The plurality of channel regions may have higher channel impurity concentration as the channel width is smaller.

At least one example embodiment relates to a semiconductor device including a plurality of nanowire patterns over a substrate, the plurality of nanowire patterns including a plurality of channels, the plurality of channels having a decreasing channel width in a direction away from the substrate; a gate electrode around one or more of the plurality of nanowire patterns; a gate dielectric film between the gate electrode and one or more of the plurality of nanowire patterns.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
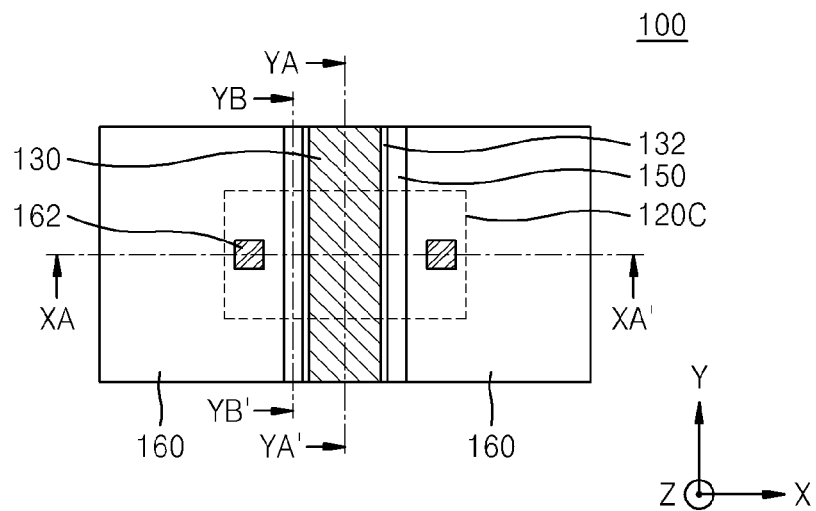
FIGS. 1A through 1D are views illustrating essential parts of a semiconductor device according to an example embodiment of the inventive concepts.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully with reference to the accompanying drawings, in which example embodiments of the inventive concepts are shown. The same elements are denoted by the same reference numerals, and a discussion thereof will not be given.

The inventive concepts will now be described more fully with reference to the accompanying drawings, in which example embodiments of the inventive concepts are shown. The inventive concepts may, however, be embodied in many different forms and should not be construed as being limited to the embodiments set forth herein; rather these embodiments are provided so that this disclosure will be thorough and complete, and will fully convey the inventive concepts to one of ordinary skill in the art.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms first, second, third etc. may be used herein to describe various members, regions, layers, portions, and/or elements, these members, regions, layers, portions, and/or elements should not be limited by these terms. These terms do not denote any order, quantity, or importance, but rather are only used to distinguish one member, region, portion, or element from another member, region, portion, or element. Thus, a first member, region, portion, or element discussed below could be termed a second member, region, portion, or element without departing from the teachings of example embodiments. For example, a first element could be termed a second element, and, similarly, a second element could be termed a first element, without departing from the scope of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In the drawing figures, the dimensions of layers and regions may be exaggerated for clarity of illustration. Like reference numerals refer to like elements throughout. The same reference numbers indicate the same components throughout the specification.

Figure 1B:
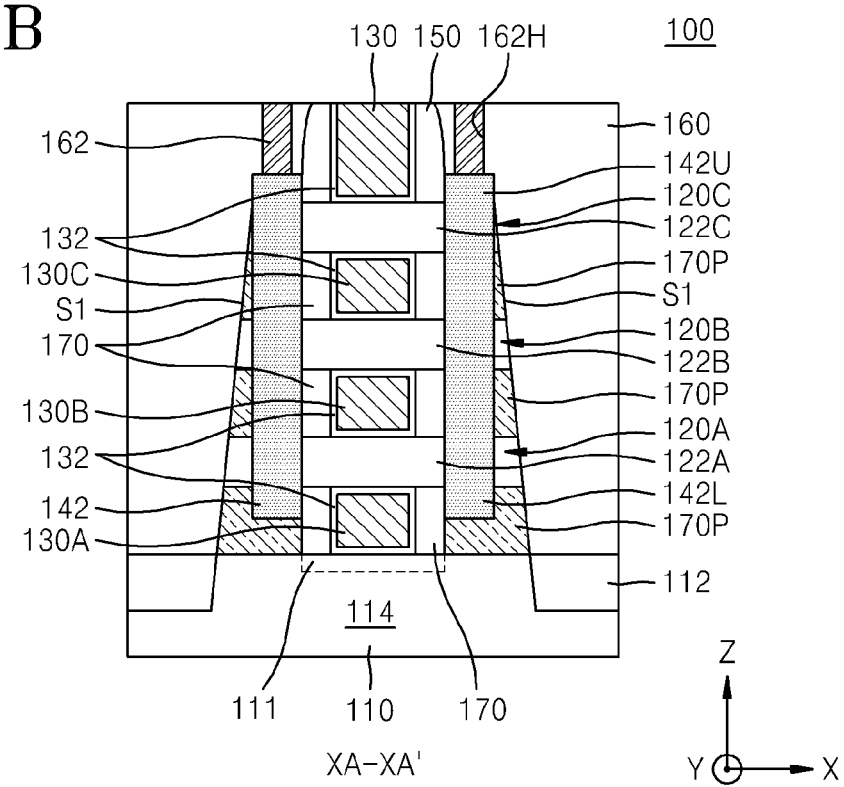
Figure 1C:
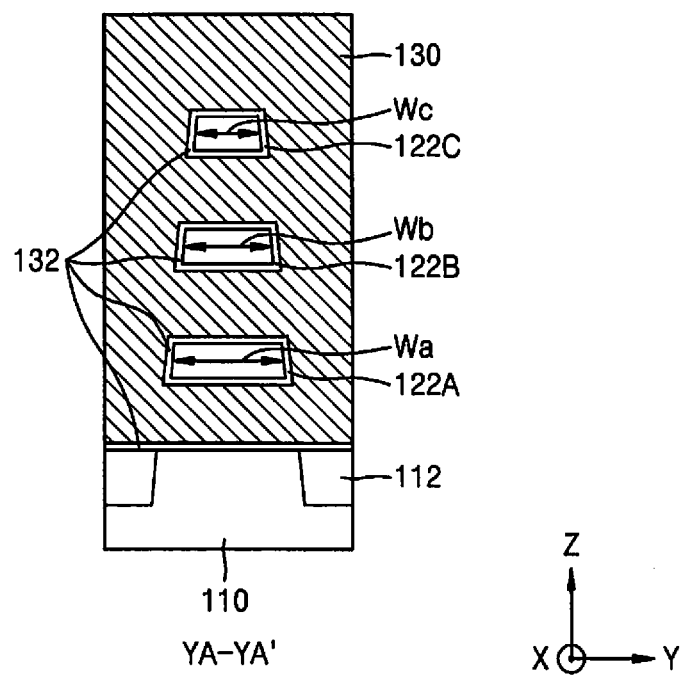
Figure 1D:
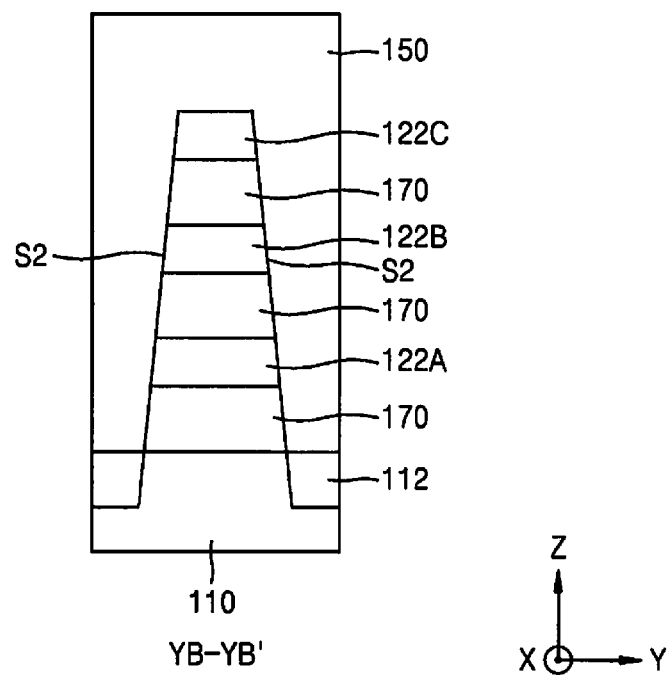

FIGS. 1A through 1D are views illustrating essential parts of a semiconductor device 100 according to an example embodiment of the inventive concepts. In detail, FIG. 1A is a plan view illustrating the semiconductor device 100. FIG. 1B is a cross-sectional view taken along line XA-XA' of FIG. 1A. FIG. 1C is a cross-sectional view taken along line YA-YA' of FIG. 1A. And, FIG. 1D is a cross-sectional view taken along line YB-YB' of FIG. 1A.

Referring to FIGS. 1A through 1D, the semiconductor device 100 includes a substrate 110 and a plurality of nanowire patterns 120A, 120B, and 120C extending in a direction (X direction) parallel to a main surface extension direction of the substrate 110 and spaced apart from the substrate 110 and have respective channel regions 122A, 122B, and 122C. Distances of the plurality of nanowire patterns 120A, 120B, and 120C from the substrate 110 may be different from one another.

An active region 114 may be defined by a device isolation film 112 in the substrate 110. A plurality of wells may be formed in the active region 114 of the substrate 110.

In an example embodiment, the substrate 110 may be a silicon substrate. In an example embodiment, the substrate 110 may constitute any one device such as, for example, a system large scale integration (LSI), a logic circuit, an image sensor such as a complementary metal-oxide-semiconductor (CMOS) imaging sensor (CIS), a flash memory, a memory device such as a dynamic random access memory (DRAM), a static random access memory (SRAM), an electrically erasable programmable read-only memory (EEPROM), a phase-change random access memory (PRAM), a magnetoresistive random-access memory (MRAM), or a resistive random access memory (RRAM), and a micro-electro-mechanical system (MEMS).

The plurality of nanowire patterns 120A, 120B, and 120C may include a first nanowire pattern 120A over the substrate 110 spaced apart from the substrate 110 by a first distance, a second nanowire pattern 120B on the first nanowire pattern 120A and spaced apart from the substrate 110 by a second distance greater than the first distance, and a third nanowire pattern 120C on the second nanowire pattern 120B and spaced apart from the substrate 110 by a third distance greater than the second distance. Although three nanowire patterns have been discussed and the first nanowire pattern 120A among the three nanowire patterns is the closest to the substrate 110 in FIGS. 1A through 1D, the example embodiment is not limited thereto. For example, the plurality of nanowire patterns 120A, 120B, and 120C may be less than 3 or more than 3.

The channel regions 122A, 122B, and 122C may include a first channel region 122A that is defined to at least a part of the first nanowire pattern 120A, a second channel region 122B that is defined to at least a part of the second nanowire pattern 120B, and a third channel region 122C that is defined to at least a part of the third nanowire pattern 120C. Although three channel regions have been discussed in FIGS. 1A through 1D, the example embodiment is not limited thereto and various modifications and changes may be made.

In an example embodiment, the channel regions 122A, 122B, and 122C may be disposed at different distances from the substrate 110 and overlap at least a part of the respective channel regions 122A, 122B, and 122C in a direction (Z direction) perpendicular with respect to a surface of the substrate 110.

In an example embodiment, the channel regions 122A, 122B, and 122C may have substantially a same thickness. Unless otherwise defined, a term "thickness" means a size in a direction perpendicular with respect to the substrate 110.

The plurality of nanowire patterns 120A, 120B, and 120C or the channel regions 122A, 122B, and 122C may be formed of a group IV semiconductor, a group IV-IV compound semiconductor, or a group III-V compound semiconductor. In an example embodiment, the plurality of nanowire patterns 120A, 120B, and 120C or the channel regions 122A, 122B, and 122C may be formed of silicon (Si), germanium (Ge), or SiGe. Alternatively, the plurality of nanowire patterns 120A, 120B, and 120C or the channel regions 122A, 122B, and 122C may be formed of InGaAs, InAs, GaSb, InSb, or a combination thereof.

The substrate 110 and the plurality of nanowire patterns 120A, 120B, and 120C may be formed of a same material or at least a part of the substrate 110 and the plurality of nanowire patterns 120A, 120B, and 120C may be formed of different materials.

The semiconductor device 100 may further comprise a plurality of sacrificial film patterns 170P that are alternately formed on the substrate 110 together with the plurality of nanowire patterns 120A, 120B, and 120C so as to be disposed between respective nanowire patterns 120A, 120B, and 120C.

The plurality of sacrificial film patterns 170P may be formed of, or include, a group IV semiconductor, a group IV-IV compound semiconductor, or a group III-V compound semiconductor.

In an example embodiment, the sacrificial film patterns 170P, the plurality of nanowire patterns 120A, 120B, and 120C and the channel regions 122A, 122B, and 122C may be formed of, or include, different materials. For example, the plurality of sacrificial film patterns 170P may be formed of, or include SiGe, and the plurality of nanowire patterns 120A, 120B, and 120C including the channel regions 122A, 122B, and 122C may be formed of, or include silicon (Si).

A pattern structure including the plurality of nanowire patterns 120A, 120B, and 120C and the plurality of sacrificial film patterns 170P being alternately stacked may be a fin shaped pattern structure that upwardly protrudes from a top surface of the device isolation film 112. All sides of the pattern structure may be surrounded by the device isolation film 112 and an interlayer dielectric film 160 may be disposed on the device isolation film 112 to cover sidewalls of the pattern structure (Refer to FIG. 1B).

As illustrated in FIG. 1B, the pattern structure may comprise both sides in the first direction (X direction) parallel to the main surface extension direction of the substrate 110. Both sides of the pattern structure in the first direction may have a first incline plane S1 having a slope of about 1 to 10 degrees from the direction (Z direction) perpendicular to the substrate 110. For example, the first incline plane S1 may have a slope of about 5 degrees from the direction (Z direction) perpendicular to the substrate 110. Accordingly, when viewed from a cross-sectional view taken along the first direction (X direction), the pattern structure may have a smaller width in a direction away from the substrate 110.

As illustrated in FIG. 1D, the pattern structure may comprise both sides in the second direction (Y direction) parallel to the main surface extension direction of the substrate 110. Both sides of the pattern structure in the second direction may have a second incline plane S2 having a slope of about 1 to 10 degrees from the direction (Z direction) perpendicular to the substrate 110. For example, the second incline plane S2 may have a slope of about 5 degrees from the direction (Z direction) perpendicular to the substrate 110. Accordingly, when viewed from a cross-sectional view taken along the second direction (Y direction), the pattern structure may have an increasingly smaller width in a direction away from the substrate 110. Respective slope angles of the first incline plane S1 and the second incline plane S2 may be the same to or different.

As the sides of the pattern structure comprise the first incline plane S1 and the second incline plane S2, a space between respective pattern structures may be filled with the interlayer dielectric film 160 without any void.

In an example embodiment, respective sides of the plurality of nanowire patterns 120A, 120B, and 120C in the first and second directions (X and Y directions) may be similar in slope to, or have the same slope as, the first incline plane S1 and the second incline plane S2 of the pattern structure, and the plurality of nanowire patterns 120A, 120B, and 120C may have increasingly smaller widths in the first and second directions (X and Y directions) as they extend away from the substrate 110. The respective sides of the plurality of nanowire patterns 120A, 120B, and 120C in the first and second directions (X and Y directions) may have a slope of about 1 to 10 degrees in a direction perpendicular with respect to the substrate 110. For example, the respective sides of the plurality of nanowire patterns 120A, 120B, and 120C in the first and second directions (X and Y directions) may have a slope of about 5 degrees in a direction perpendicular with respect to the substrate 110.

In an example embodiment, as both sides of the pattern structure in the second direction (Y direction) comprise the second incline plane S2, both sides of the plurality of channel regions 122A, 122B, and 122C in the second direction (Y direction) parallel to the main surface extension direction of the substrate 110 may be similar in slope to, or have the same slope as, the second incline plane S2. Accordingly, the plurality of channel regions 122A, 122B, and 122C may have smaller widths in the second direction (Y direction) in a direction away from the substrate 110. Both sides of the plurality of channel regions 122A, 122B, and 122C in the second direction (Y direction) may have a slope of about 1 to 10 degrees from a direction perpendicular to the substrate 110. For example, both sides of the plurality of channel regions 122A, 122B, and 122C in the second direction (Y direction) may have a slope of about 5 degrees from a direction perpendicular to the substrate 110.

The first direction (X direction) corresponds to a channel length direction of the channel regions 122A, 122B, and 122C and the second direction (Y direction) corresponds to a channel width direction of the channel regions 122A, 122B, and 122C. Accordingly, the channel regions 122A, 122B, and 122C may comprise a predetermined, or alternatively desired, channel length extending along the first direction (X direction) parallel to the main surface extension direction of the substrate 110 and a predetermined, or alternatively desired, channel width extending along the second direction (Y direction) parallel to the main surface extension direction of the substrate 110.

The first channel region 122A may comprise a first channel impurity concentration and a first channel width Wa. The second channel region 122B may comprise a second channel impurity concentration and a second channel width Wb. And the third channel region 122C may comprise a third channel impurity concentration and a third channel width Wc. (Refer to FIG. 1C)

In an example embodiment, the second channel impurity concentration may be greater than the first channel impurity concentration and may be smaller than the third channel impurity concentration.

In an example embodiment, the second channel width Wb may be smaller than the first channel width Wa and may be greater than the third channel width Wc.

As the sides of the pattern structure comprise the first incline plane S1 and the second incline plane S2, respective channel widths Wa, Wb, and Wc of the channel regions 122a, 122B, and 122C may be different from one another. For example, the channel widths Wa, Wb, and Wc of the channel regions 122A, 122b, and Wc may decrease as they extend away from the substrate 110.

If the channel width of at least one channel region among the channel regions 122A, 122B, and 122C decreases, a channel threshold voltage of the channel region having the decreased channel width may be increased by increasing an energy band gap due to a quantum confinement effect. Thus, if the channel regions 122A, 122B, and 122C have different channel widths, respective channel threshold voltages of the channel regions 122A, 122B, and 122C may also be different, and therefore, the total on-current amount may be decreased.

As illustrated in FIGS. 1A through 1D, the nanowire pattern structure stacked by the plurality of nanowire patterns on the substrate 110 may be able to receive a larger amount of on-current from the same wafer area than a conventional FinFET (fin field effect transistor) structure. The nanowire pattern structure may comprise nanowire patterns of at least three layers. As the number of nanowire patterns that are stacked on the substrate 110 increases, the channel widths of respective channel regions formed in the nanowire patterns decrease remarkably in a direction away from the substrate 110. Accordingly, the quantum confinement effect may be more remarkable.

According to the example inventive concepts, in order to improve the on-current characteristics, respective channel impurity concentrations of the channel regions 122A, 122B, and 122C may be adjusted so as to equalize respective channel threshold voltages of the channel regions 122A, 122B, and 122C. For example, respective channel threshold voltages of the second and third channel regions 122B and 122C may be lowered by increasing the respective channel impurity concentrations of the second and third channel regions 122B and 122C to be greater than the channel impurity concentration of the first channel region 122A.

In an example embodiment, respective channel threshold voltages of the second and third channel regions 122B and 122C may be substantially the same as the channel threshold voltages of the first channel region 122A that is the closest to the substrate 110.

In an example embodiment, the respective first, second and third channel impurity concentrations of the first, second and third channel regions 122A, 122B, and 122C may be adjusted by implanting impurity ions into at least a part of the plurality of nanowire patterns 120A, 120B, and 120C after forming the plurality of nanowire patterns 120A, 120B, and 120C on the substrate 110.

In another example embodiment, the respective first, second and third channel impurity concentrations of the first, second and third channel regions 122A, 122B, and 122C may be adjusted by injecting impurity ions into at least a part of the plurality of nanowire patterns 120A, 120B, and 120C using an in-situ doping method during an epitaxial growth process for forming the plurality of nanowire patterns 120A, 120B, and 120C.

In another example embodiment, the first channel region 122A that is the closest to the substrate 110 among the first, second and third channel regions 122A, 122B, and 122C may include an undoped semiconductor material.

In an example embodiment, a channel may be prevented or substantially prevented from being formed on the surface of the substrate 110 facing the first channel region 122A.

According to at least one example embodiment, the gate electrode 130 surrounds at least a part of the respective channel regions 122A, 122B, and 122C of the plurality of nanowire patterns 120A, 120B, and 120C on the substrate 110. The gate electrode 130 may include a plurality of sub-gate electrodes 130A, 130B, and 130C in a space between the substrate 110 and the plurality of nanowire patterns 120A, 120B, and 120C. The gate electrode 130 may be disposed by passing through the respective sacrificial film patterns 170P and surrounding the respective channel regions 122A, 122B, and 122C.

In an example embodiment, the gate electrode 130 may include a doped polysilicon, a metal, or a combination thereof. For example, the gate electrode 130 may be formed of, or include, but is not limited thereto, aluminum (Al), copper (Cu), titanium (Ti), tantalum (Ta), tungsten (W), molybdenum (Mo), TaN, NiSi, CoSi, TiN, WN, TiAl, TiAlN, TaCN, TaC, TaSiN, or a combination thereof.

The gate electrode 130 may extend across at least one active region 114 and the nanowire patterns 120A, 120B, and 120C in the second direction (Y direction) parallel to a main surface extension direction of the substrate 110.

A gate dielectric film 132 may be between the channel regions 122A, 122B, and 122C and the gate electrode 130. In an example embodiment, the gate dielectric film 132 may be a silicon oxide film, a silicon oxynitride film, a high-k film having a dielectric constant higher than the dielectric constant of a silicon oxide film, or a combination thereof. For example, the gate dielectric film 132 may include the high-k (high dielectric constant) film such as, but is not limited thereto, $HfO_2$, HfSiO, HfSiON, HfTaO, HfTiO, HfZrO, zirconium oxide, aluminum oxide, a $HfO_2$—$Al_2O_3$ alloy, or a combination thereof.

A gate spacer 150 may cover both sides of the gate electrode 130 on which the gate dielectric film 132 is disposed.

A pair of source/drain regions 142 that extend in the direction (Z direction) perpendicular to a main surface of the substrate 110 and are connected to both end portions of the respective channel regions 122A, 122B, and 122C may be formed on the substrate 110. In an example embodiment, the source/drain regions 142 may include semiconductor films implanted with n-type impurity ions or p-type impurity ions. For example, the source/drain regions 142 may be formed of, but are not limited thereto, a doped SiGe film, a doped Ge film, a doped SiC film, or a doped InGaAs film. In an example embodiment, the source/drain regions 142 may be formed of a material that is different from the materials of the substrate 110 and the nanowire patterns 120A, 120B, and 120C.

The source/drain regions 142 may have a lattice constant that is different from a lattice constant of the respective nanowire patterns 120A, 120B, and 120C, so that the source/drain regions 142 may be configured to be a stressor for applying a compressive or a tensile stress to the plurality of the channel regions 122A, 122B, and 122C.

The source/drain regions 142 may include embedded type source/drain regions that are re-grown using an epitaxial growth process from the nanowire patterns 120A, 120B, and 120C and/or the sacrificial film patterns 170P.

The source/drain regions 142 may include an upper part 142U thereof that upwardly protrudes from the third channel region 122C on the opposite side of the substrate 110, and a bottom part 142L thereof that is positioned between the substrate 110 and the first channel region 122A. The bottom part 142L of the source/drain regions 142 is spaced apart from the substrate 110 by a distance to make the sacrificial film pattern 170P intervening therebetween. The sacrificial film pattern 170P between the bottom part 142L of the source/drain regions 142 and the substrate 110 may have a high resistance due to its relatively low doping concentration. Accordingly, a channel may be prevented, or substantially prevented, from being formed on the surface of the substrate 110 facing the sub-gate electrode 130A being the closest to the substrate 110. Therefore, short-channel effect in the semiconductor device 100 may be minimized.

A part of both end portions of respective nanowire patterns 120A, 120B, and 120C adjacent to the source/drain regions 142 may be covered with the gate spacer 150.

According to at least one example embodiment, the source/drain regions 142 and parts of the gate spacer 150 may be covered with the interlayer dielectric film 160. The source/drain regions 142 may be connected to a contact 162 disposed in a contact hole 162H formed through the interlayer dielectric film 160. A plurality of insulating spacers 170 are between the substrate 110 and the plurality of nanowire patterns 120A, 120B, and 120C, and between the sacrificial film patterns 170P and the plurality of sub-gate electrodes 130A, 130B, and 130C. The insulating spacer 170 may be between the sub-gate electrodes 130A, 130B, and 130C and the source/drain regions 142. Also, the gate dielectric film 132 may be between the respective sub-gate electrodes 130A, 130B, and 130C and the respective insulating spacers 170. The insulating spacers 170 may be formed of, or include, a material that is different from the gate dielectric film 132. In an example embodiment, the insulating spacer 170 may be formed of, or include a material that has a dielectric constant lower than a dielectric constant of a material of the gate dielectric film 132. Accordingly, gate parasitic capacitance between the gate electrode 130 and the source/drain regions 142 may be reduced or suppressed.

In an example embodiment, the insulating spacers 170 may be formed of or include an oxide of a group IV semiconductor, an oxide of a group IV-IV compound semiconductor, an oxide of a group III-V compound semiconductor, or a silicon oxide. For example, the insulating spacers 170 may be formed of, or include, but are not limited thereto, a SiGe oxide, an InP oxide, or a silicon oxide.

In another example embodiment, the insulating spacers 170 may extend to the sacrificial film patterns 170P. In still another example embodiment, the bottom part 142L of the source/drain regions 142 may be spaced apart from the substrate 110 by a distance to make the insulating spacers 170 intervening therebetween.

A buffer oxide film 111 may be in a portion of the substrate 110 facing the sub-gate electrode 130A that is the closest to the substrate 110 and the insulating spacers 170 adjacent to the sub-gate electrode 130A. The buffer oxide film 111 may prevent a channel from forming on the surface of the substrate 110. Accordingly, short-channel effect in the semiconductor device 100 may be minimized.

The gate dielectric film 132 may extend from surfaces of the respective channel regions 122A, 122B, and 122C to surfaces of sidewalls of the insulating spacers 170 so as to be between the sub-gate electrodes 130A, 130B, and 130C and the insulating spacers 170 and between the substrate 110 and the nanowire patterns 120A, 120B, and 120C.

The gate spacer 150 and the insulating spacers 170 may be disposed at different levels on the substrate 110 in the direction (Z direction) perpendicular to the main surface extension direction of the substrate 110 to vertically overlap with each other. The gate spacer 150 may cover a portion of each surface of the insulating spacers 170. In an example embodiment, the insulating spacers 170 may be formed of, or include a material that is different from the gate spacer 150. In an example embodiment, the insulating spacers 170 may be formed of, or include an insulating material that has a dielectric constant that is lower than a dielectric constant of an insulating material of the gate spacer 150.

The semiconductor device 100 may constitute a transistor. In an example embodiment, when an N-type well is formed in the active region 114 of the substrate 110 and P-type impurities are doped into the source/drain regions 140, the semiconductor device 110 may constitute a P-type metal-oxide-semiconductor (PMOS) transistor. Alternatively, when a P-type well is formed in the active region 114 of the substrate 1410 and N-type impurities are doped into the source/drain region 140, the semiconductor device 110 may constitute an N-type metal-oxide-semiconductor (NMOS) transistor.

A carrier mobility of a MOS transistor greatly affects power consumption and switching performance of a device. A switching speed may be increased and the device may be operated at a low voltage by increasing the carrier mobility, thereby reducing power consumption. In an example embodiment, in order to increase a carrier mobility in the semiconductor device 100 constituting a MOS transistor, the channel regions 122A, 122B, and 122C of the plurality of nanowire patterns 120A, 120B, and 120C may have a strained channel.

In an example embodiment, when the semiconductor device 100 constitutes a PMOS transistor, in order to provide the nanowire patterns 120A, 120B, and 120C including a strained channel, the nanowire patterns 120A, 120B, and 120C may be formed of Si, and the source/drain regions 142 that are connected to both end portions of the nanowire patterns 120A, 120B, and 120C may be formed of doped SiGe or doped Ge. Alternatively, when the semiconductor device 100 constitutes a PMOS transistor, in order to provide the nanowire patterns 120A, 120B, and 120C including a strained channel, the nanowire patterns 120A, 120B, and 120C may be formed of Ge, and the source/drain regions 142 may be formed of SiGe. Alternatively, when the semiconductor device 100 constitutes an NMOS transistor, in order to provide the nanowire patterns 120A, 120B, and 120C including a strained channel, the nanowire patterns 120A, 120B, and 120C may be formed of or include Si, and the source/drain regions 142 may be formed of doped SiC.

FIGS. 2A through 10D are views according to a process order for explaining a method of manufacturing a semiconductor device according to an example embodiment of the inventive concepts. A method of manufacturing the semiconductor device 100 of FIGS. 2A through 10D will be discussed. From among FIGS. 2A through 10D, FIGS. 2A, 3A, . . . , and FIG. 10A are plan views for explaining each process order, FIGS. 2B, 3B, . . . , and FIG. 10B are cross-sectional views taken along line XA-XA' of FIGS. 2A, 3A, and 10A, FIGS. 4C, 5C, 8C, 9C and FIG. 10C are cross-sectional views taken along line YA-YA' of FIGS. 4A, 5A, 8A, 9A and FIG. 10A, and FIGS. 8D, 9D, and 10D are cross-sectional views taken along line YB-YB' of FIGS. 8A, 9A, and 10A, FIG. 8E is a perspective view of FIGS. 8A, 8B, 8C and FIG. 8D. In FIGS. 2A through 10D, the same elements as those in FIGS. 1A through 1D are denoted by the same reference numerals, and a discussion thereof will not be given in order to avoid a redundant discussion.

Figure 2A:
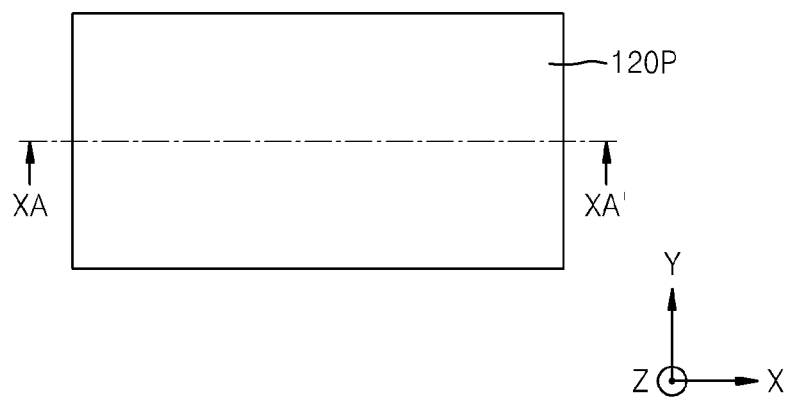
FIGS. 2A through 10D are views according to a process order for explaining a method of manufacturing a semiconductor device according to an example embodiment of the inventive concepts, FIGS. 2A, 3A, . . . , and FIG. 10A being plan views for explaining each process order, FIGS. 2B, 3B, . . . , and FIG. 10B being cross-sectional views taken along line XA-XA' of FIGS. 2A, 3A, and 10A, FIGS. 4C, 5C, 8C, 9C and FIG. 10C being cross-sectional views taken along line YA-YA' of FIGS. 4A, 5A, 8A, 9A and FIG. 10A, and FIGS. 8D, 9D, and 10D being cross-sectional views taken along line YB-YB' of FIGS. 8A, 9A, and 10A, FIG. 8E are perspective views of FIGS. 8A, 8B, 8C and FIG. 8D.
Figure 2B:
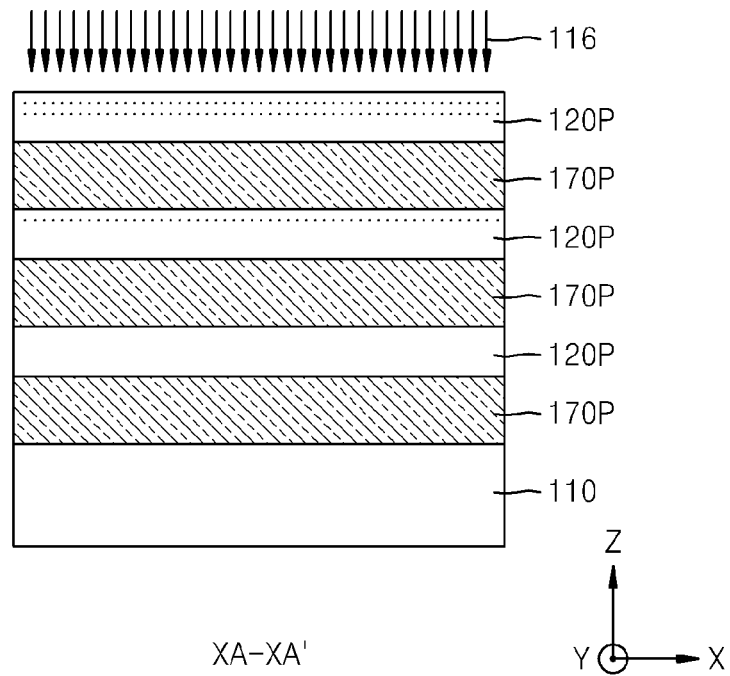

Referring to FIGS. 2A and 2B, a plurality of sacrificial films 170P and a plurality of channel semiconductor films 120P are alternately formed on the substrate 110 several times. Although three sacrificial films 170P and three channel semiconductor films 120P are alternately formed in FIGS. 2A and 2B, the example embodiment is not limited thereto.

In an example embodiment, the substrate 110 may be formed of silicon (Si).

The sacrificial films 170P and the channel semiconductor films 120P may be formed of single crystalline semiconductor materials having etch selectivities with respect to each other.

In an example embodiment, the sacrificial films 170P and the channel semiconductor films 120P may be formed of a group IV semiconductor, a group IV-IV compound semiconductor, or a group III-V compound semiconductor, and the sacrificial films 170P and the channel semiconductor films 120P may be formed of different materials. For example, the sacrificial films 170P may be formed of SiGe and the channel semiconductor films 120P may be formed of single crystalline silicon.

The sacrificial films 170P and the channel semiconductor films 120P may be formed by using epitaxial growth process.

As discussed with reference to FIGS. 1A through 1D, in order to substantially equalize respective channel threshold voltages of the channel regions 122A, 122B, and 122C with each other, the respective channel impurity concentrations of the channel regions 122A, 122B, and 122C may be adjusted differently with each other. To do so, in an example embodiment, an implantation process using impurity ions 116 may be preceded on a resultant structure formed by the plurality of channel semiconductor films 120P. The implantation process of impurity ions 116 may enable the channel semiconductor films 120P to have a higher doping concentration as they extend away from the substrate 110, such that a channel semiconductor film 120P being the closest to the substrate 110 among the channel semiconductor films 120P may have the lowest doping concentration, and a channel semiconductor film 120P being the farthest from the substrate 110 may have the highest doping concentration. In an example embodiment, the channel semiconductor film 120P that is the closest to the substrate 110 may be not doped with the impurity ions 116.

In another example embodiment, the respective channel impurity concentrations of the channel regions 122A, 122B, and 122C may be adjusted differently relatively to each other by injecting impurity ions into the plurality of channel semiconductor films 120P using an in-situ doping method during an epitaxial growth process for forming the plurality of channel semiconductor films 120P so as to enable the channel semiconductor films 120P to have a higher doping concentrations away from the substrate 110.

Figure 3A:
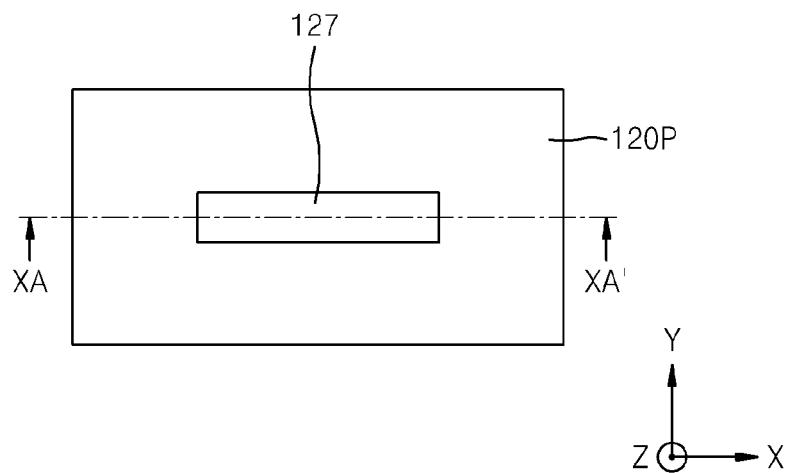
Figure 3B:
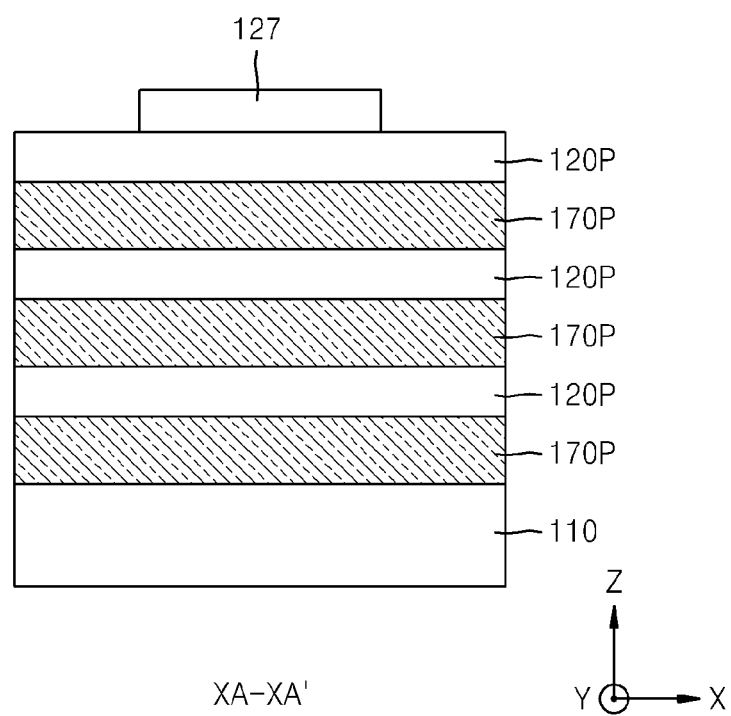

Referring to FIGS. 3A through 3B, a hard mask pattern 127 may be formed on the plurality of channel semiconductor films 120P. The hard mask pattern 127 may be formed of a material having an etch selectivity with respect to the substrate 110, the plurality of sacrificial films 170P, and the plurality of channel semiconductor films 120P. In an example embodiment, the hard mask pattern 127 may be formed of oxide film, nitride film, or a combination thereof, but the example embodiment is not limited thereto.

Figure 4A:
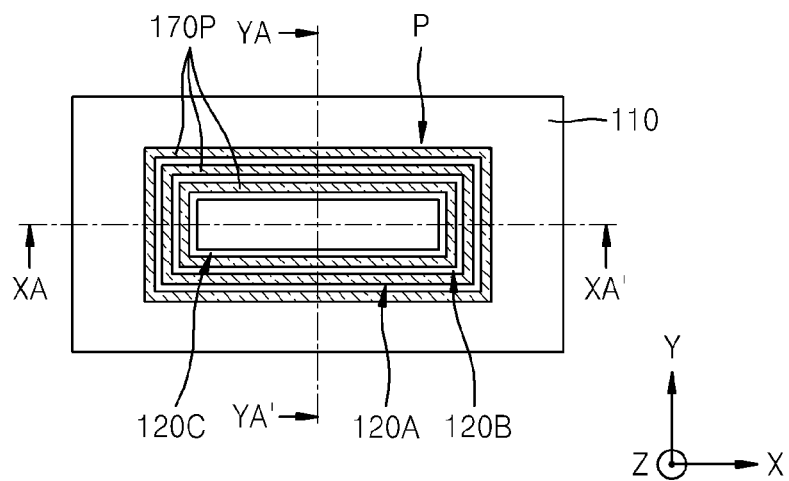
Figure 4B:
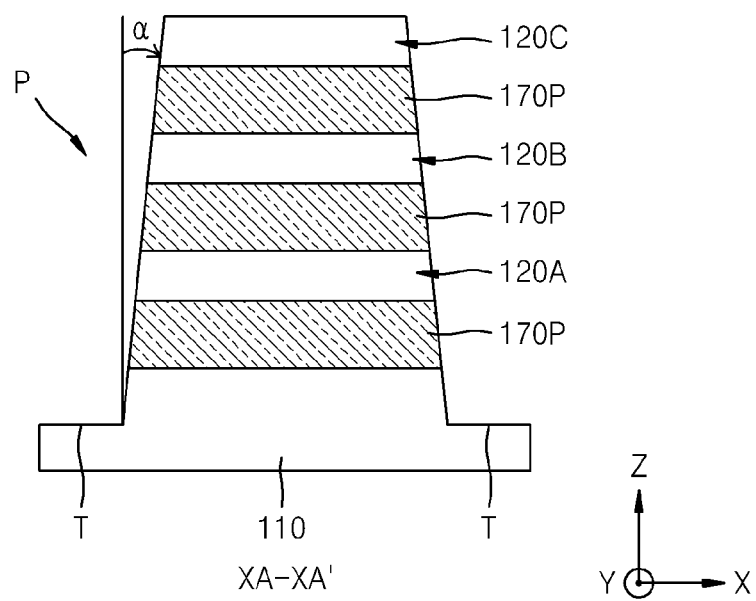
Figure 4C:
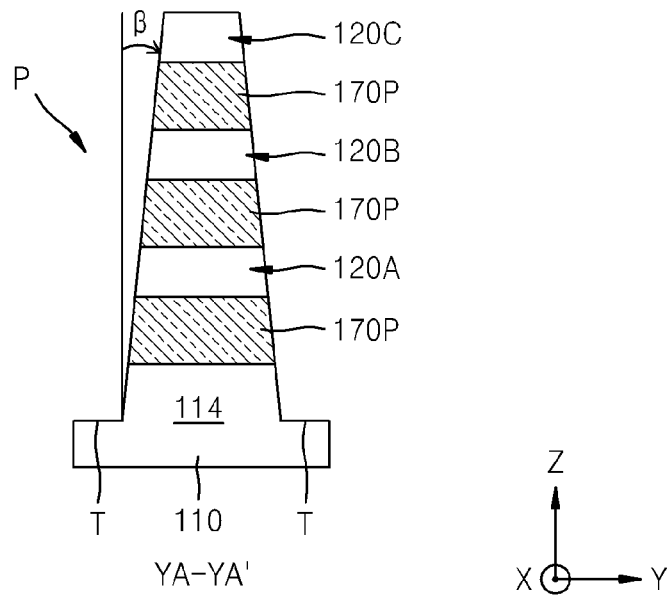

Referring to FIGS. 4A through 4C, parts of the respective the channel semiconductor films 120P, the sacrificial films 170P, and the substrate 110 may be sequentially patterned by using the hard mask pattern 127 discussed in FIGS. 3A through 3B as an etch mask. Hence, a pattern structure P including the plurality of nanowire patterns 120A, 120B, and 120C obtained from the plurality of channel semiconductor films 120P and the plurality of sacrificial film patterns 170P obtained from the plurality of sacrificial films 170P is formed. The plurality of nanowire patterns 120A, 120B, and 120C may include the first nanowire pattern 120A, the second nanowire pattern 120B, and the third nanowire pattern 120C. A trench region T that is formed as a result of patterning the substrate 110 is exposed around the pattern structure P.

After forming the pattern structure P, the hard mask pattern 127 is removed.

In an example embodiment, as discussed in FIG. 4B, both sides of the pattern structure P in the first direction (X direction) parallel to the main surface extension direction of the substrate 110 may have a slope α in the direction (Z direction) perpendicular to the substrate 110 and may have a smaller width in a direction away from the substrate 110. The slope α may be about 1 to 10 degrees. For example, the slope α may be about 5 degrees.

In another example embodiment, as discussed in FIG. 4C, both sides of the pattern structure P in the second direction (Y direction) parallel to the main surface extension direction of the substrate 110 may have a slope β in the direction (Z direction) perpendicular to the substrate 110, and may have a smaller width in a direction away from the substrate 110. The slope β may be about 1 to 10 degrees. For example, the slope β may be about 5 degrees.

Figure 5A:
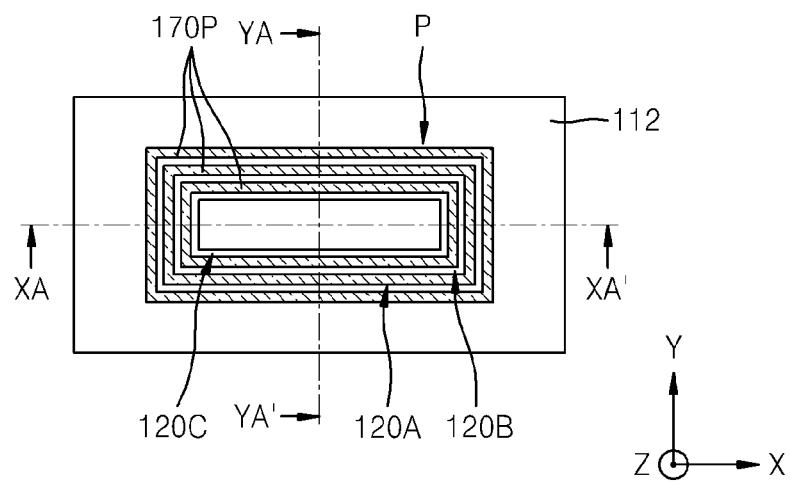
Figure 5B:
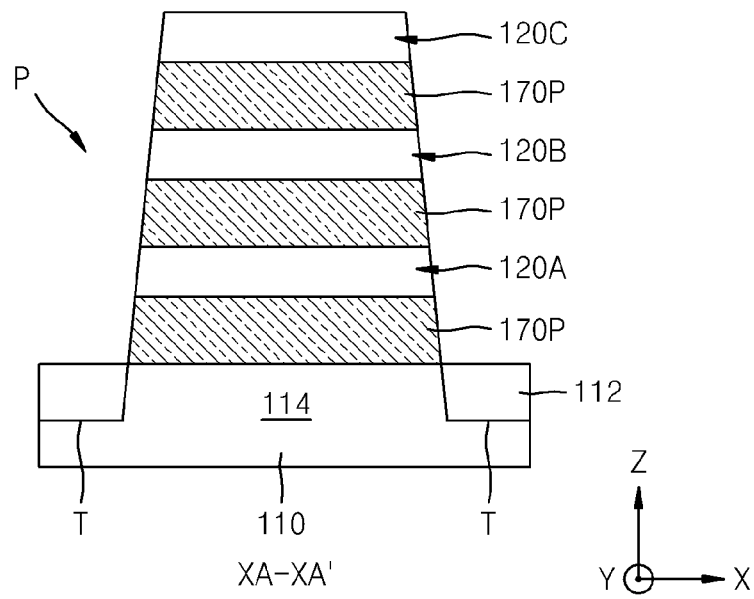
Figure 5C:
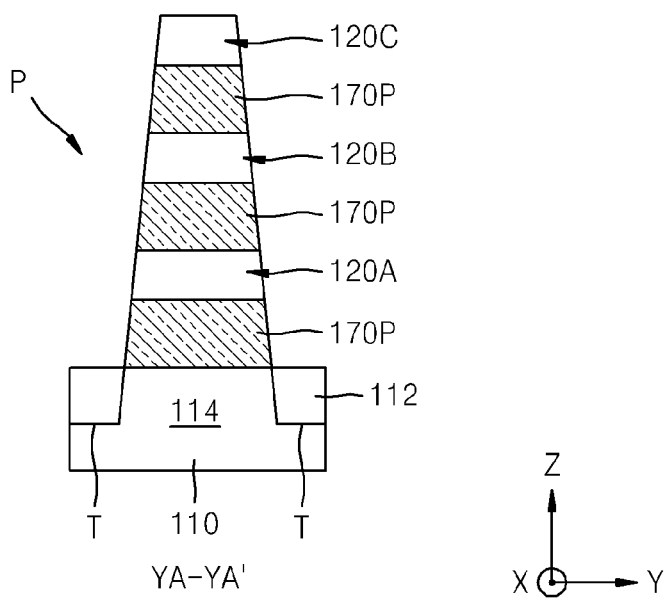

Referring to FIGS. 5A through 5C, the device isolation film 112 having a planarized top surface is formed by filling an insulating material in the trench T of the substrate 110. The active region 114 may be defined in the substrate 110 by the device isolation film 112. In an example embodiment, the top surface of the device isolation film 112 may be substantially co-planar with a top surface of the active region 114. The device isolation film 112 may be formed of an oxide film, a nitride film, or a combination thereof.

Next, the active region 114 may include a well into which a predetermined, or alternatively desired, type of impurity ions is implanted. When a PMOS transistor is formed in the active region 114, the well is an N-type well. When an NMOS transistor is formed, the well is a P-type well.

Figure 6A:
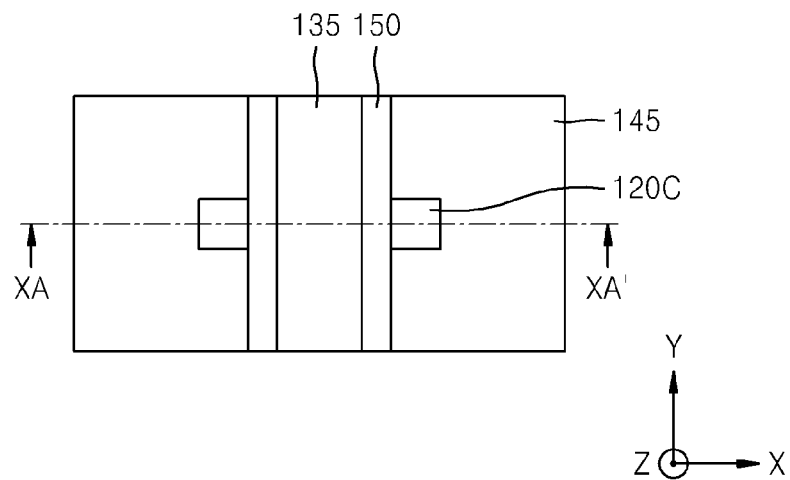
Figure 6B:
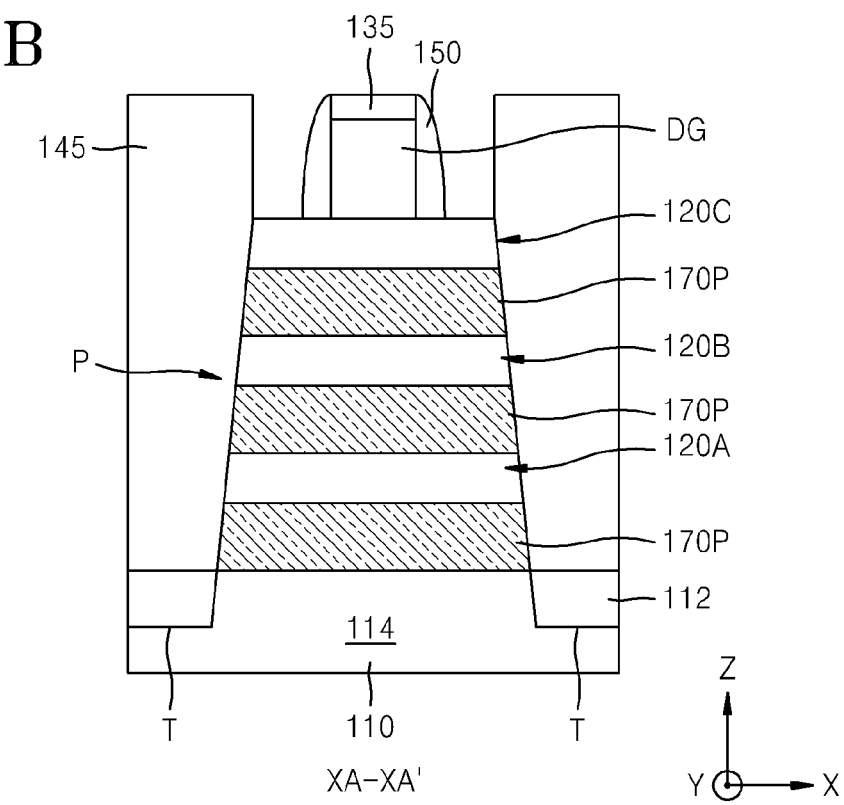

Referring to FIGS. 6A and 6B, a dummy gate DG that covers top surfaces of the device isolation film 112 and the pattern structure P may be formed. In an example process for forming the dummy gate DG, a dummy gate film that covers top surfaces of the device isolation film 112 and the pattern structure P is formed, and a capping pattern 135 that covers a portion of a top surface of the dummy gate film corresponding to a gate region is formed. The dummy gate DG may be then be formed by patterning the dummy gate film using the capping pattern 135 as an etch mask.

The gate spacer 150 that covers both sidewalls of the dummy gate DG and the capping pattern 135 may be formed In an example embodiment, the dummy gate DG may be formed of or include polysilicon. The capping pattern 135 may be formed of or include a silicon nitride film. The gate spacer 150 may be formed of or include silicon oxide film, silicon nitride film, or a combination thereof, but is not limited thereto. And then, a photoresist pattern 145 that covers the device isolation film 112 around the pattern structure P may be formed on the substrate 110. A portion of a top surface of the third nanowire pattern 120C around both sides of the dummy gate DG may be exposed through the photoresist pattern 145.

Figure 7A:
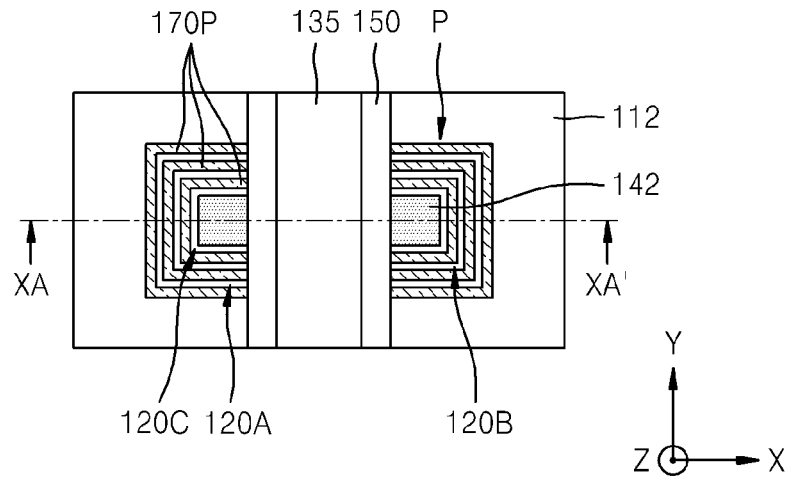
Figure 7B:
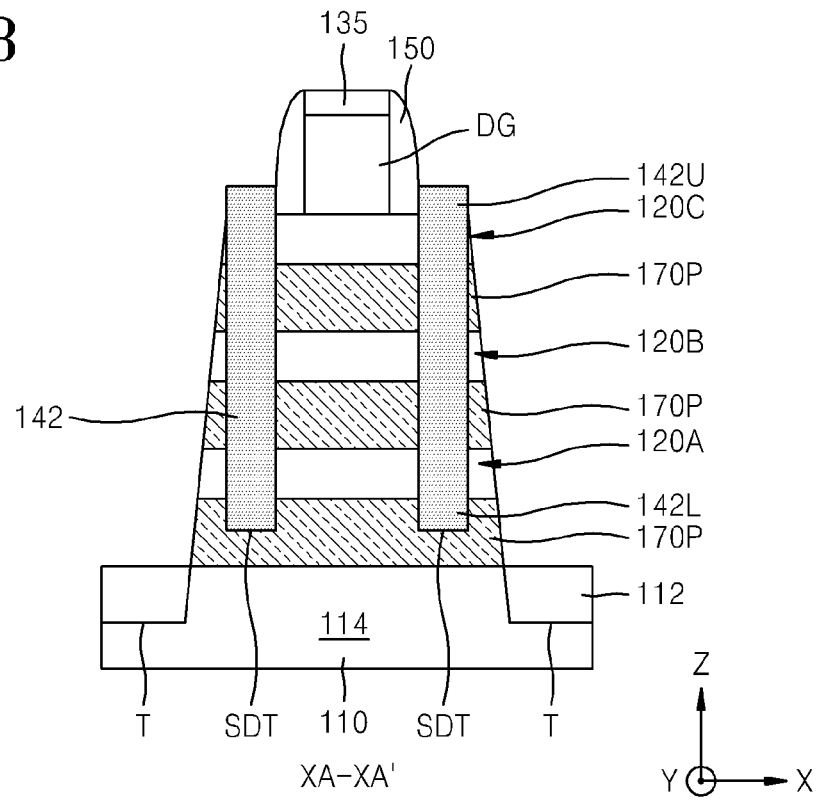

Referring to FIGS. 7A through 7B, a pair of source/drain trenches SDT may be around both sides of the dummy gate DG by patterning the plurality of nanowire patterns 120A, 120B, and 120C and the plurality of sacrificial film patterns 170P using the capping pattern 135, the gate spacer 150 and the photoresist pattern 145 as an etch mask (Refer to FIG. 6B)

A portion of the sacrificial film pattern 170P being the closest to the substrate 110 among the plurality of sacrificial film patterns 170P may be exposed at bottom surfaces of the respective source/drain trenches SDT.

After removing the photoresist pattern 145, the pair of source/drain regions 142 may fill in the pair of source/drain trenches SDT by re-growing a single crystalline film from the nanowire patterns 120A, 120B, and 120C and/or the sacrificial film patterns 170P exposed in the source/drain trenches SDT using a selective epitaxy process.

In an example embodiment, the pair of source/drain regions 142 may have cross-sectional shapes that are self-aligned by the gate spacer 150. The respective source/drain regions 142 may include an upper part 142U thereof that upwardly protrudes from the third nanowire pattern 120C across from the substrate 110, and a bottom part 142L thereof that is spaced apart from the substrate 110 to interpose the sacrificial film pattern 170P being the closest to the substrate 110 between the substrate 110 and the bottom part 142L.

The pair of source/drain regions 142 may be connected to both end portions of the plurality of nanowire patterns 120A, 120B, and 120C.

In an example embodiment, when a PMOS transistor is on the substrate 110, the pair of source/drain regions 142 may be formed of a SiGe film or a Ge film. When the pair of the source/drain regions 142 are formed of or include a SiGe film, the source/drain regions 142 may have a Ge concentration gradient such that a Ge concentration decreases toward the substrate 110 and increases away from the substrate 110 in the source/drain regions 142.

Alternatively, when an NMOS transistor is to be formed on the substrate 110, the pair of source/drain regions 142 may be formed of or include a SiC film.

The source/drain regions 142 may be formed by implanting N-type or P-type impurity ions according to a channel type of a transistor on the substrate 110.

In the method of manufacturing the semiconductor device of the example embodiment, impurity ions may be constantly doped at a relatively high dose in situ during a re-growth process for forming the source/drain regions 142. Accordingly, resistance of the source/drain regions 142 may be greatly reduced.

Referring to FIGS. 8A through 8E, the interlayer dielectric film 160 may be on the resultant structures of FIGS. 7A through 7B that are formed by the pair of source/drain regions 142, and the dummy gate DG may be exposed by removing the capping pattern 135, a portion of the gate spacer 150, and a portion of the interlayer dielectric film 160 using a planarization process and/or an etch-back process. Next, a gate space GS may be formed between the pair of gate spacers 150 by removing the exposed dummy gate DG.

Figure 8A:
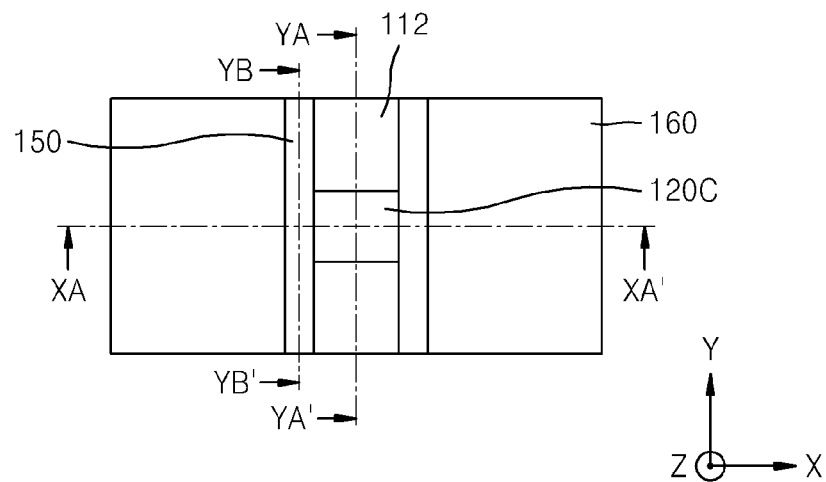
Figure 8B:
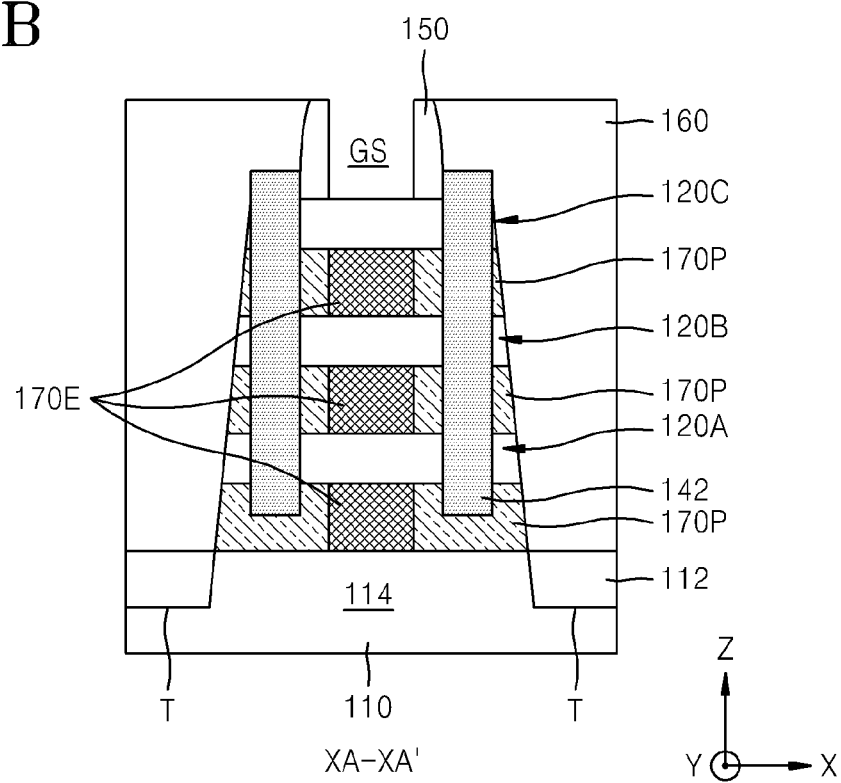
Figure 8C:
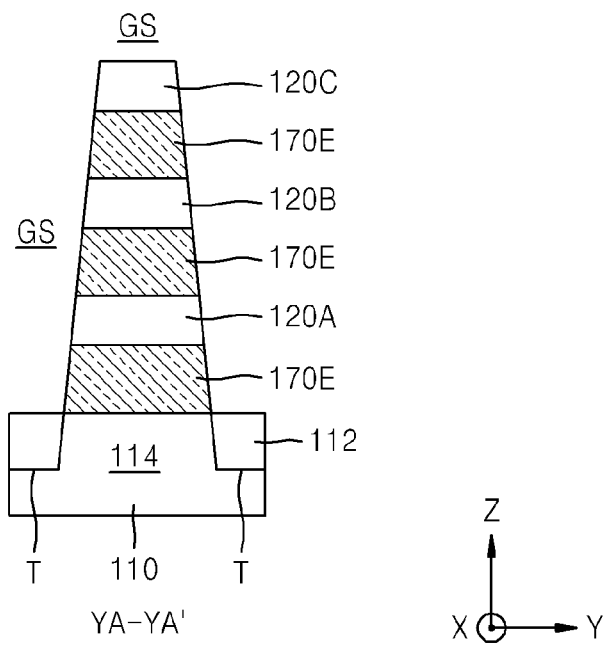
Figure 8D:
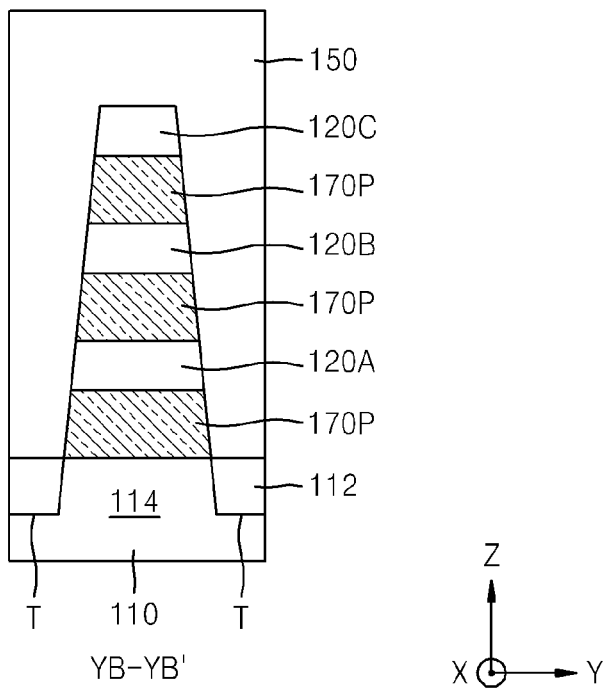
Figure 8E:
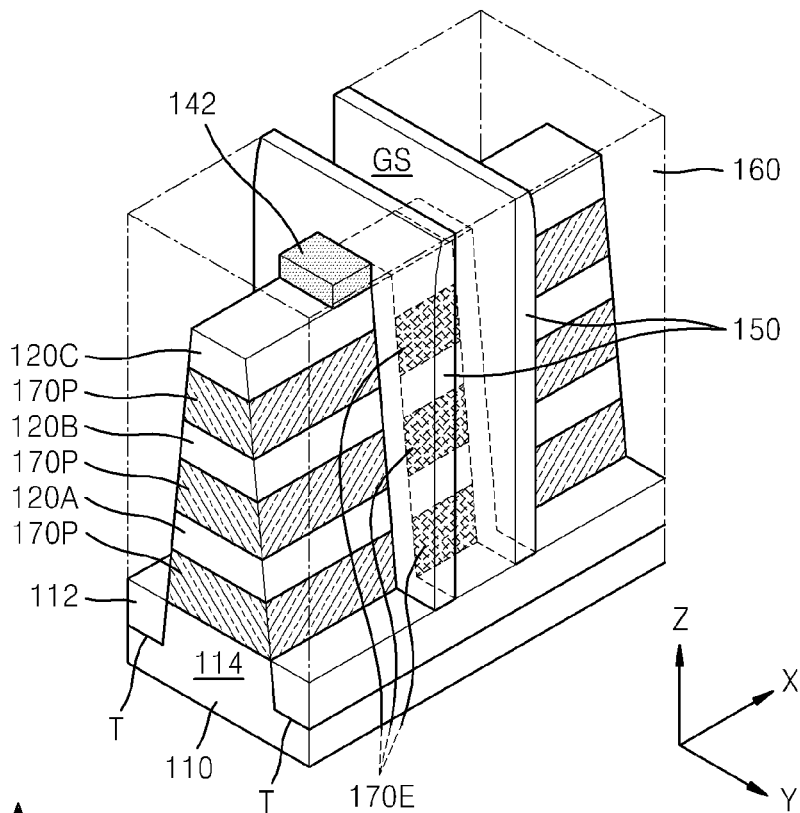

As illustrated in FIGS. 8C and 8E, a part of the plurality of nanowire patterns 120A, 120B, and 120C and a part 170E of the sacrificial film patterns 170P may be exposed through the gate space GS. As illustrated in FIGS. 8D and 8E, in an example embodiment, a part of the plurality of nanowire patterns 120A, 120B, and 120C and a part of the sacrificial film patterns 170P may be covered with the gate spacer 150.

Referring to FIGS. 9A through 9D, the gate space GS may be in a space between the respective nanowire patterns 120A, 120B, and 120C and in a space between the substrate 110 and the first nanowire pattern 120A by selectively removing the parts 170E of the respective sacrificial film patterns 170P that are exposed through the gate space GS.

While the parts 170E of the respective sacrificial film patterns 170P which are exposed through the gate space GS are removed, parts of the sacrificial film patterns 170P which are covered with the gate spacers 150 may be protected by the gate spacers 150 without being removed, and thus may remain as residual sacrificial film patterns 170R.

Figure 9A:
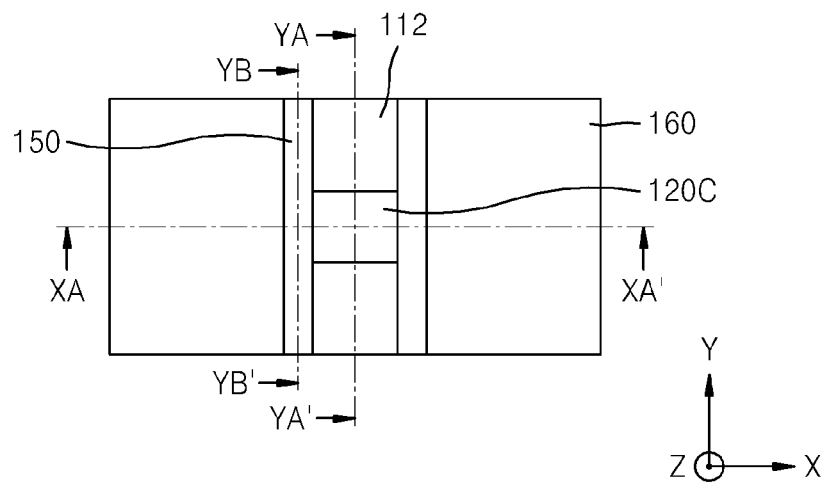
Figure 9B:
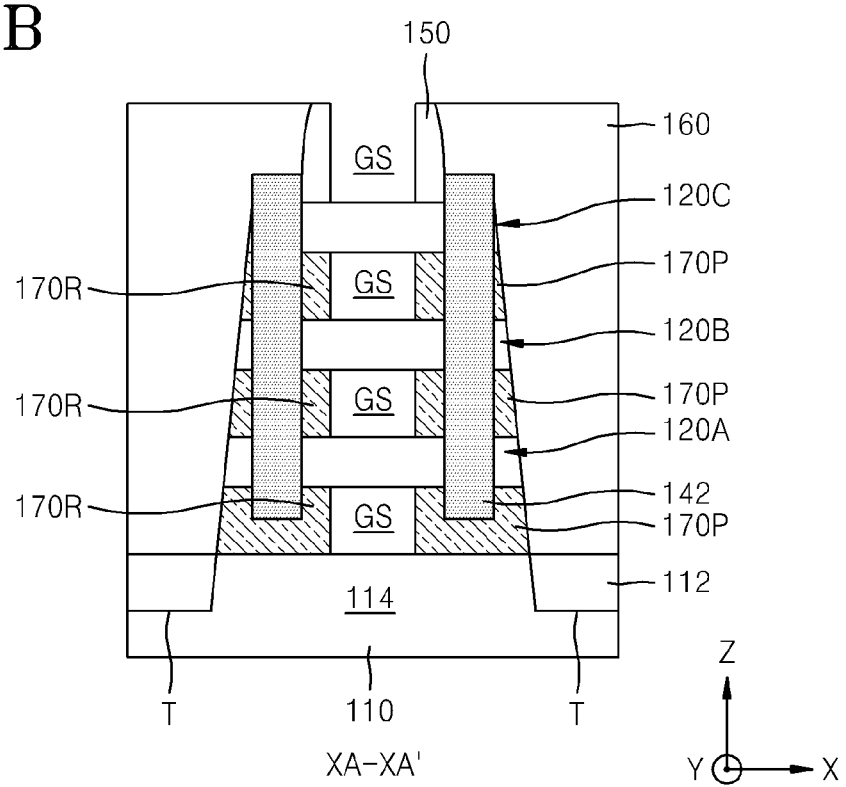
Figure 9C:
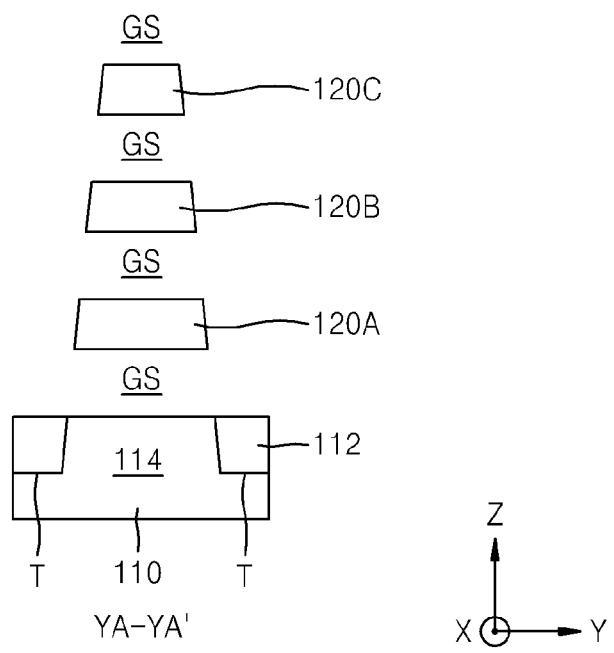
Figure 9D:
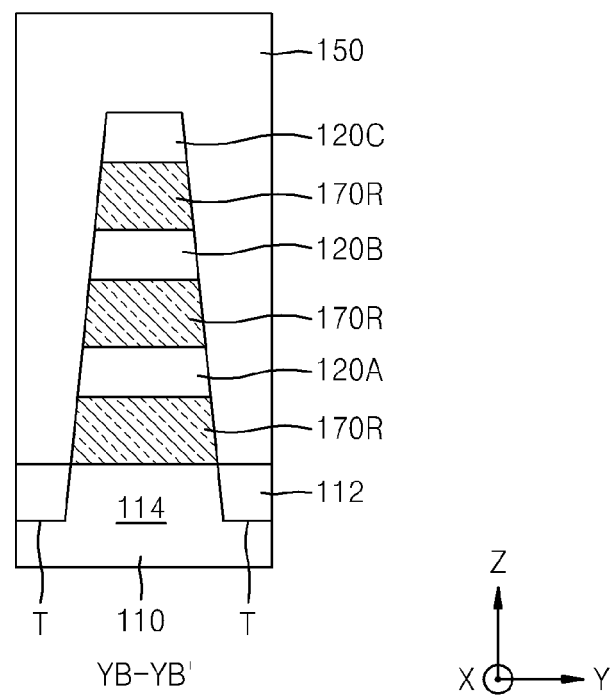
Figure 10A:
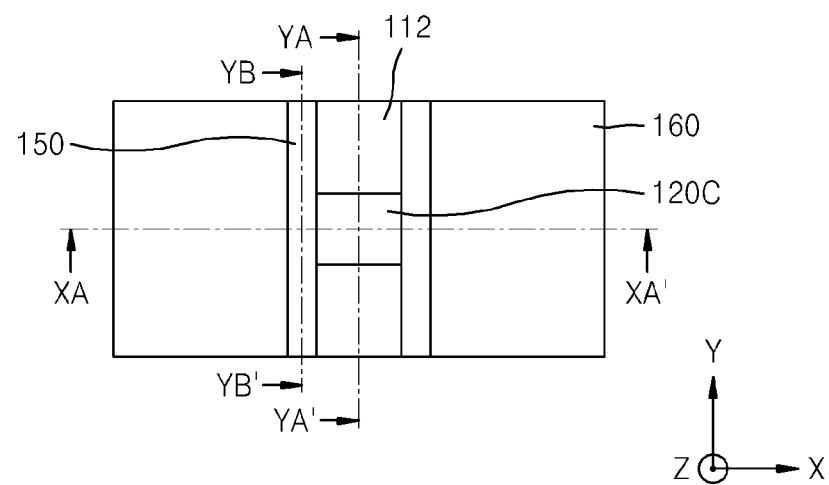
Figure 10B:
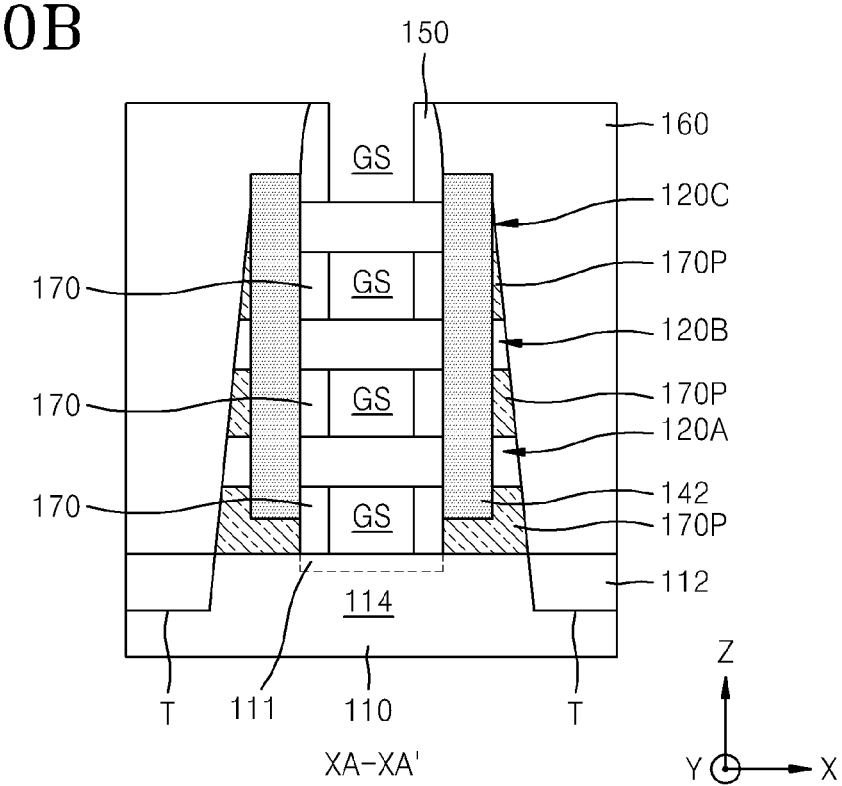
Figure 10C:
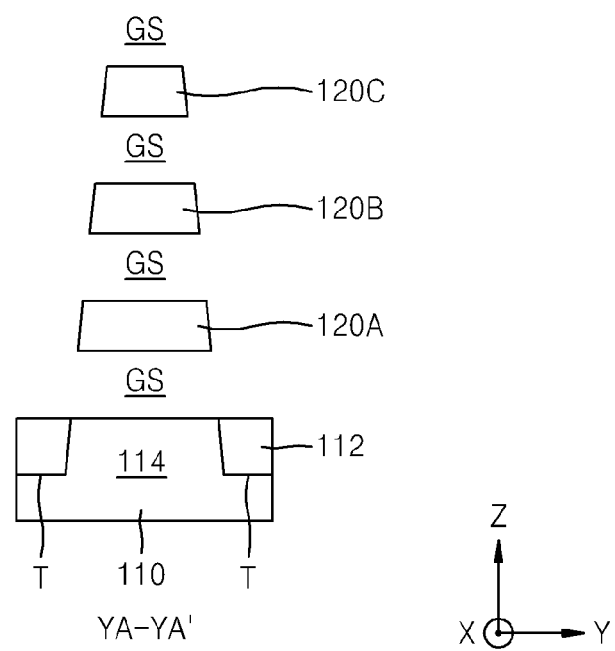
Figure 10D:
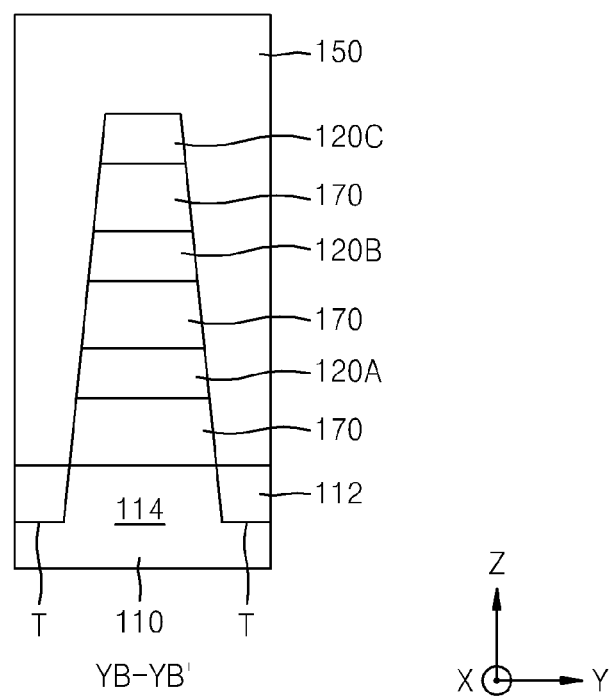

Referring to FIGS. 10A through 10D, a plurality of insulating spacers 170 may be formed by oxidizing parts thereof between the source/drain regions 142 among the residual sacrificial film patterns 170R that remain in spaces between the substrate 110 and the first nanowire pattern 120A, between the first nanowire pattern 120A and the second nanowire pattern 120B, and between the second nanowire pattern 120B and the third nanowire pattern 120C in FIGS. 9B and 9D.

In order to form the insulating spacers 170, the substrate 110 on which the residual sacrificial film patterns 170R remains may be maintained for a predetermined, or alternatively desired, period of time, for example, for about 1 minute to about 50 minutes, in an oxidizing atmosphere. An oxygen ($O_2$) gas may be used as an oxidizing gas. The oxidizing atmosphere may be maintained at a temperature ranging from about 400° C. to about 700° C. For example, if the residual sacrificial film patterns 170R are formed of SiGe and the nanowire patterns 120A, 120B, and 120C are formed of Si, the substrate 110 may be placed in an oxidation chamber that is maintained at a temperature of about 600° C., and may be maintained for about 30 minutes by supplying an $O_2$ gas to the substrate 110. In this case, an oxidation rate of the residual sacrificial film patterns 170R formed of SiGe may be much higher than an oxidation rate of each of the nanowire patterns 120A, 120B, and 120C and the substrate 110. Accordingly, while the residual sacrificial film patterns 170R is completely oxidized into a SiGe oxide, a relatively thin surface oxide film may be formed on the surfaces of the nanowire patterns 120A, 120B, and 120C and the substrate 110. At this time, if needed, a buffer oxide film 111 having a predetermined, or alternatively desired, thickness may be formed on the surface of the substrate 110 between the pair of source/drain regions 142.

In an example embodiment, the plurality of insulating spacers 170 may be formed by removing the residual sacrificial film patterns 170R between the gate space GS and the source/drain regions 142 and then, by depositing an oxide film therein.

Next, the surface oxide film that is formed on the exposed surface of the nanowire patterns 120A, 120B, and 120C is removed and then, as illustrated in FIGS. 1A through 1D, the gate dielectric film 132 is formed on exposed surfaces in the gate space GS, that is, on exposed surfaces of the nanowire patterns 120A, 120B, and 120C, on exposed surfaces of the insulating spacers 170, and on exposed surfaces of the pair of gate spacers 150. The gate electrode 130 is then formed on the gate dielectric film 132 to fill the gate space GS. For example, the gate electrode 130 may include the sub-gate electrodes 130A, 130B, and 130B that are formed in the respective spaces between the substrate 110 and the plurality of nanowire patterns 120A, 120b, and 120C.

Next, as illustrated in FIG. 1B, in order to form the semiconductor device 100 of FIGS. 1A through 1D, a plurality of contact holes 162H through which the source/drain regions 142 are exposed are formed by etching a part of the interlayer dielectric film 160, and then the contacts 162 may be formed in the respective contact holes 162H to be connected to the pair of source/drain regions 142.

The semiconductor device according to the example inventive concepts discussed with reference to FIGS. 1A through 10D may constitute a transistor constituting a digital circuit or an analog circuit. In an example embodiment, the semiconductor device may be used as a high voltage transistor or a low voltage transistor. For example, the semiconductor device may constitute a high-voltage transistor constituting a peripheral circuit of a nonvolatile memory device such as a flash memory device or an EEPROM device that operates at a high voltage. Alternatively, the example semiconductor device may constitute a transistor included in an integrated circuit (IC) chip that is used for a liquid crystal display (LCD) IC device that requires an operating voltage of 10 V or more, for example, about 20 V to about 30 V, or a plasma display panel (PDP) that requires an operating voltage of about 100 V.

Figure 11:
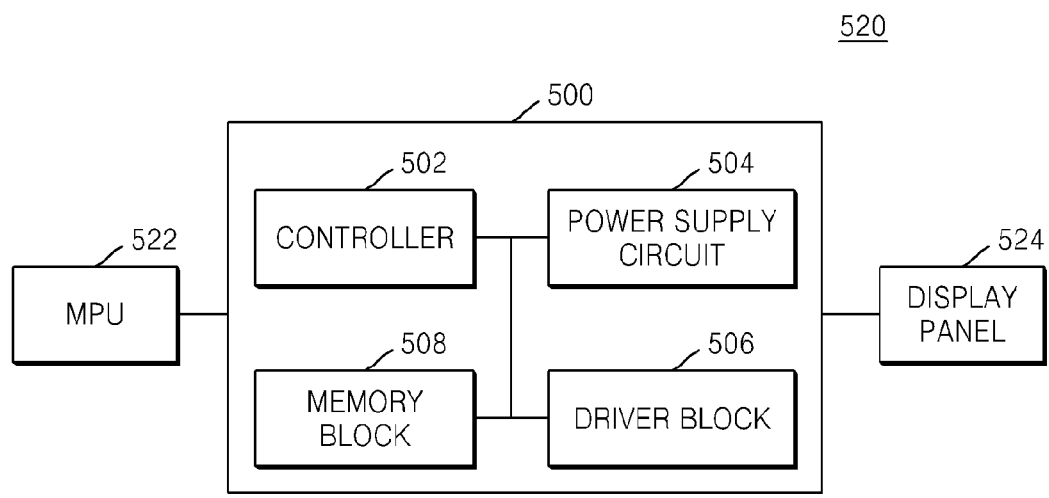
FIG. 11 is a block diagram illustrating a display driver integrated circuit (DDI) and a display device including the DDI, according to an example embodiment of the inventive concepts.

FIG. 11 is a block diagram illustrating a display driver IC (DDI) 500 and a display device 520 including the DDI 500, according to an example embodiment of the inventive concepts.

Referring to FIG. 11, the DDI 500 may include a controller 502, a power supply circuit 504, a driver block 506, and a memory block 508. The controller 502 receives and decodes a command applied from a main processing unit (MPU) 522, and controls blocks of the DDI 500 in order to perform an operation in response to the command. The power supply circuit 504 generates a driving voltage under the control of the controller 502. The driver block 506 drives the display panel 524 by using the driving voltage generated by the power supply circuit 504 under the control of the controller 502. The display panel 524 may be an LCD panel or a plasma display panel. The memory block 508 may temporarily store control signals output from the controller 502 or a command input to the controller 502, or may store necessary data. The memory block 508 may include a memory such as a RAM or a ROM. The power supply circuit 504 and the driver block 506 may include the semiconductor device 100 of FIGS. 1A through 10D.

Figure 12:
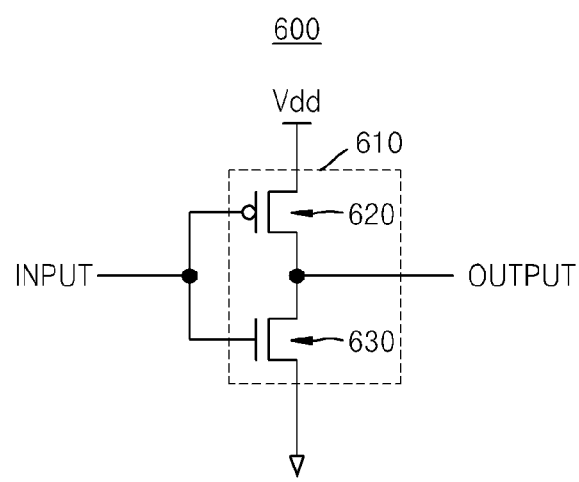
FIG. 12 is a circuit diagram illustrating a complementary metal-oxide-semiconductor (CMOS) inverter according to an example embodiment of the inventive concepts.

FIG. 12 is a circuit diagram illustrating a CMOS inverter 600 according to an example embodiment of the inventive concepts.

The CMOS inverter 600 includes a CMOS transistor 610. The CMOS transistor 610 includes a PMOS transistor 620 and an NMOS transistor 630 that are connected between a power terminal Vdd and a ground terminal. The CMOS transistor 610 may include the semiconductor device 100 of FIGS. 1A through 10D.

Figure 13:
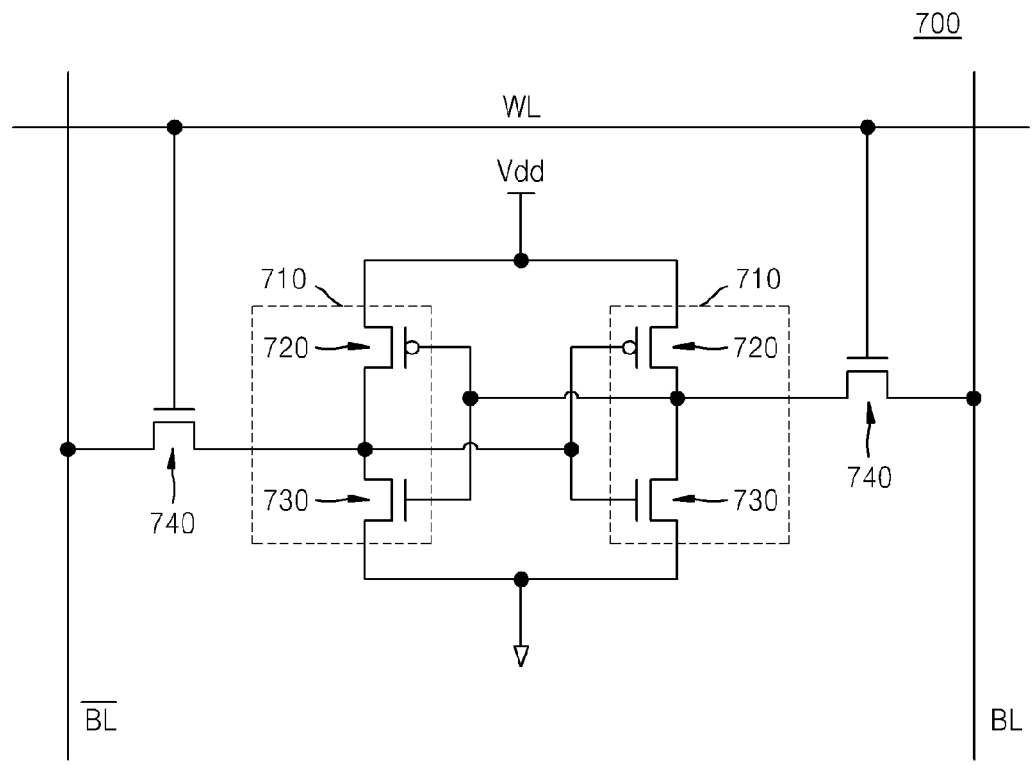
FIG. 13 is a circuit diagram illustrating a CMOS static random access memory (SRAM) device according to an example embodiment of the inventive concepts.

FIG. 13 is a circuit diagram illustrating a CMOS SRAM device 700 according to an example embodiment of the inventive concepts.

The CMOS SRAM device 700 includes a pair of driving transistors 710. Each of the driving transistors 710 includes a PMOS transistor 720 and an NMOS transistor 730 connected between a power terminal Vdd and a ground terminal. The CMOS SRAM device 700 further includes a pair of transmission transistors 740. A source of each of the transmission transistors 740 is cross-connected to a common node of the PMOS transistor 720 and the NMOS transistor 730 constituting the driving transistor 710. The power terminal Vdd is connected to a source of the PMOS transistor 720, and the ground terminal is connected to a source of the NMOS transistor 730. A word line WL is connected to gates of the transmission transistors 740, and a bit line BL and an inverted bit line are respectively connected to drains of the transmission transistors 740.

At least one of the driving transistor 710 and the transmission transistor 740 of the CMOS SRAM device 700 may include the semiconductor device 100 of FIGS. 1A through 10D.

Figure 14:
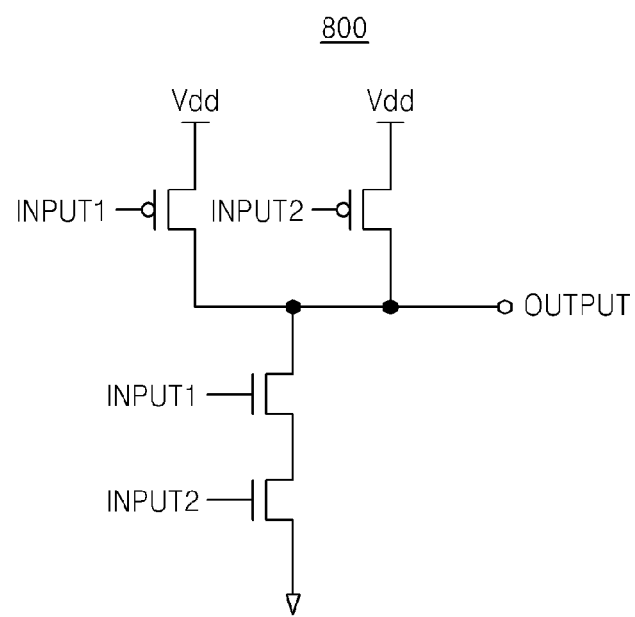
FIG. 14 is a circuit diagram illustrating a CMOS NAND circuit according to an example embodiment of the inventive concepts.

FIG. 14 is a circuit diagram illustrating a CMOS NAND circuit 800 according to an example embodiment of the inventive concepts.

The CMOS NAND circuit 800 includes a pair of CMOS transistors to which different input signals are transmitted. The CMOS NAND circuit 800 may include the semiconductor device 100 of FIGS. 1A through 10D.

Figure 15:
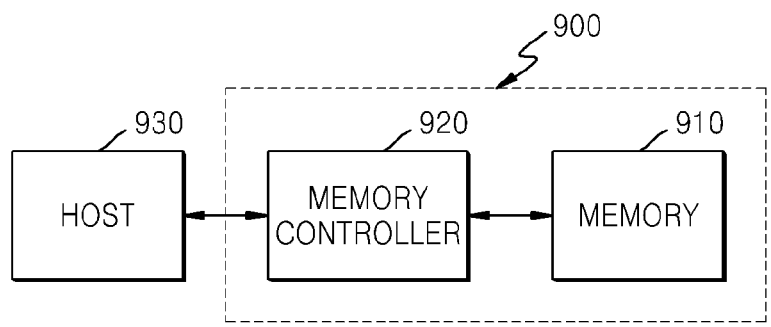
FIG. 15 is a block diagram illustrating an electronic system according to an example embodiment of the inventive concepts.

FIG. 15 is a block diagram illustrating an electronic system 900 according to an example embodiment of the inventive concepts.

The electronic system 900 includes a memory 910 and a memory controller 920. The memory controller 920 controls the memory 910 to read data from the memory 910 and/or write data to the memory 910 in response to a request of a host 930. At least one of the memory 910 and the memory controller 920 may include the semiconductor device 100 of FIGS. 1A through 10D.

Figure 16:
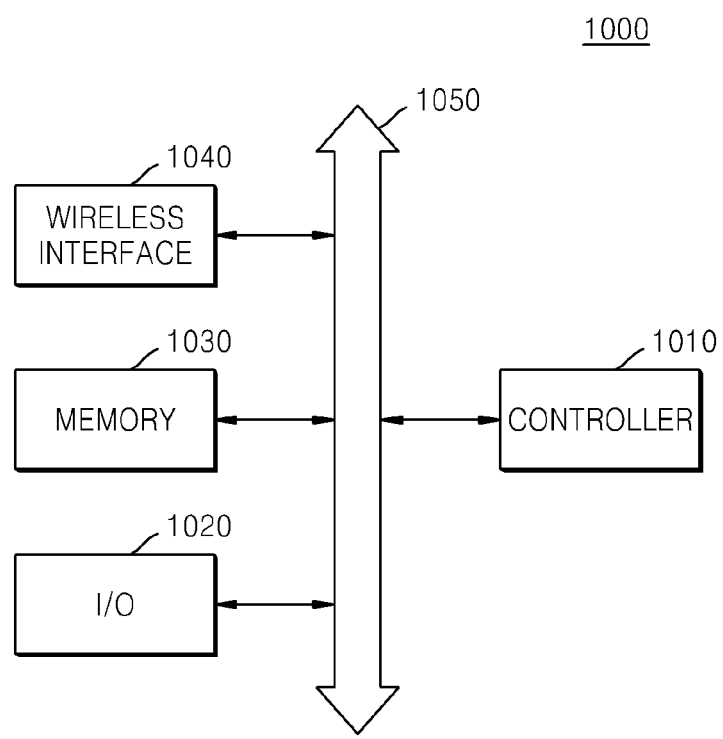
FIG. 16 is a block diagram illustrating an electronic system according to an example embodiment of the inventive concepts.

FIG. 16 is a block diagram illustrating an electronic system 1000 according to another example embodiment of the inventive concepts.

The electronic system 1000 may constitute a wireless communication device or a device for wirelessly transmitting and/or receiving information. The electronic system 1000 includes a controller 1010, an input/output (I/O) device 1020, a memory 1030, and a wireless interface 1040, which are connected to one another via a bus 1050.

The controller 1010 may include at least one of a microprocessor, a digital signal process, and a processing device. The I/O device 1020 may include at least one of a keypad, a keyboard, and a display unit. The memory 1030 may be used to store a command executed by the controller 1010. For example, the memory 1030 may be used to store user data. The electronic system 1000 may use the wireless interface 1040 in order to transmit/receive data through a wireless communication network. The wireless interface 1040 may include an antenna and/or a wireless transceiver. In an embodiment, the electronic system 1000 may be used for a communication interface protocol of a third generation communication system such as code division multiple access (CDMA), global system for mobile communications (GSM), north American digital cellular (NADC), extended-time division multiple access (E-TDMA), and/or wide band code division multiple access (WCDMA). The electronic system 1000 may include the semiconductor device 100 of FIGS. 1A through 10D.

In the semiconductor device according to an example embodiment of the inventive concepts, the respective channel regions of the plurality of nanowire patterns may have different channel impurity concentrations. Accordingly, an on-current characteristics of a multiple nanowire transistor may be substantially improved by equalizing respective channel threshold voltages of the channel regions that are different from each other due to a difference of channel widths between the channel regions.

While the inventive concepts has been particularly shown and described with reference to example embodiments thereof, it will be understood that various changes in form and details may be made therein without departing from the spirit and scope of the following claims.

What is claimed is:

1. A semiconductor device comprising:
    a substrate extending in a longitudinal direction;
    at least two nanowire patterns over the substrate;
    a gate electrode surrounding at least a part of the at least two nanowire patterns; and
    a gate dielectric film between the at least two nanowire patterns and the gate electrode in a direction substantially perpendicular to the longitudinal direction, wherein longitudinal widths of the at least two nanowire patterns become narrower in a direction away from the substrate and have different channel impurity concentrations;
    wherein the at least two nanowire patterns include:
    a first nanowire pattern having a first channel region at a first distance from the substrate and having a first channel impurity concentration and a first channel width, and
    a second nanowire pattern having a second channel region at a second distance from the substrate greater than the first distance, having a second channel impurity concentration higher than the first channel impurity concentration, and having a second channel width smaller than the first channel width; and
    wherein the at least two nanowire patterns further include a third nanowire pattern having a third channel region at a third distance from the substrate greater than the second distance, having a third channel impurity concentration higher than the second channel impurity concentration, and a third channel width smaller than the second channel width, wherein the first channel threshold voltage of the first channel region is substantially the same as the third channel threshold voltage of the third channel region.

2. The semiconductor device of claim 1, wherein the at least two nanowire patterns include respective channel regions that have higher channel impurity concentrations in the direction away from the substrate and have different channel widths.

3. The semiconductor device of claim 2, wherein the respective channel regions have a substantially same channel threshold voltage.

4. The semiconductor device of claim 2, further comprising:
    a pair of source/drain regions connected to respective end portions of the respective channel regions of the at least two nanowire patterns, and spaced apart from the substrate by a distance.

5. The semiconductor device of claim 1, wherein the at least two nanowire patterns include one nanowire pattern closest to the substrate, wherein the one nanowire pattern comprises an undoped semiconductor material.

6. The semiconductor device of claim 1, wherein the first channel threshold voltage of the first channel region is substantially the same as the second channel threshold voltage of the second channel region.

7. The semiconductor device of claim 1, wherein the at least two nanowire patterns have substantially a same thickness.

8. The semiconductor device of claim 1, further comprising:
a plurality of sacrificial film patterns between nanowire patterns of the at least two nanowire patterns, respectively, wherein the gate electrode passes through at least a part of each sacrificial film pattern.

9. The semiconductor device of claim 1, wherein the at least two nanowire patterns are at different distances from the substrate such that at least a part of the respective nanowire patterns overlap in a direction perpendicular with respect to a surface of the substrate.

10. The semiconductor device of claim 1, further comprising:
a device isolation film, wherein the at least two nanowire patterns are part of a fin shaped pattern structure that upwardly protrudes from a top surface of the device isolation film.

11. A semiconductor device, comprising:
a plurality of nanowire patterns over a substrate extending in a longitudinal direction, wherein longitudinal widths and transversal widths of the plurality of nanowire patterns become narrower in a direction away from the substrate, the plurality of nanowire patterns having a plurality of channels, the plurality of channels having a decreasing longitudinal channel width in a direction away from the substrate;
a gate electrode around one or more of the plurality of nanowire patterns;
a gate dielectric film between the gate electrode and one or more of the plurality of nanowire patterns in a direction substantially perpendicular to the longitudinal direction.

12. The semiconductor device of claim 11, wherein:
a channel threshold voltage of one or more of the channels increases in a direction away from the substrate.

13. The semiconductor device of claim 11, wherein the gate electrode comprises a plurality of sub-gate electrodes, each of the sub-gate electrodes being between two adjacent channels.

14. The semiconductor device of claim 11, wherein a width of one or more of the plurality of nanowire patterns decreases in the direction away from the substrate.

15. The semiconductor device of claim 11, further comprising:
one or more sacrificial film patterns between two adjacent nanowire patterns of the plurality of nanowire patterns.

* * * * *